US010943552B2

(12) United States Patent
Kim et al.

(10) Patent No.: US 10,943,552 B2
(45) Date of Patent: Mar. 9, 2021

(54) SHIFT REGISTER UNIT, GATE DRIVE CIRCUIT AND METHOD OF DRIVING THE SAME

(71) Applicant: BOE TECHNOLOGY GROUP CO., LTD., Beijing (CN)

(72) Inventors: Jiha Kim, Beijing (CN); Seungwoo Han, Beijing (CN); Guangliang Shang, Beijing (CN); Haoliang Zheng, Beijing (CN); Xing Yao, Beijing (CN); Zhichong Wang, Beijing (CN); Mingfu Han, Beijing (CN); Lijun Yuan, Beijing (CN); Yunsik Im, Beijing (CN); Jing Lv, Beijing (CN); Xue Dong, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 383 days.

(21) Appl. No.: 15/768,309

(22) PCT Filed: Oct. 31, 2017

(86) PCT No.: PCT/CN2017/108587
§ 371 (c)(1),
(2) Date: Apr. 13, 2018

(87) PCT Pub. No.: WO2018/133491
PCT Pub. Date: Jul. 26, 2018

(65) Prior Publication Data
US 2020/0258463 A1 Aug. 13, 2020

(30) Foreign Application Priority Data
Jan. 22, 2017 (CN) .......................... 201710054473.3

(51) Int. Cl.
G09G 3/36 (2006.01)
G11C 19/28 (2006.01)
G09G 3/3266 (2016.01)

(52) U.S. Cl.
CPC ........... G09G 3/3677 (2013.01); G11C 19/28 (2013.01); G09G 3/3266 (2013.01);
(Continued)

(58) Field of Classification Search
None
See application file for complete search history.

(56) References Cited

U.S. PATENT DOCUMENTS 7,057,598 B2 * 6/2006 Azami ................ G02F 1/13306
345/100
9,494,830 B2 * 11/2016 Yamazaki ............. G02F 1/1343
(Continued)

FOREIGN PATENT DOCUMENTS

CN 103345911 A 10/2013
CN 103474037 A 12/2013
(Continued)

OTHER PUBLICATIONS

International Search Report & Written Opinion dated Jan. 29, 2018, regarding PCT/CN2017/108587.
(Continued)

Primary Examiner — Benjamin X Casarez
(74) Attorney, Agent, or Firm — Intellectual Valley Law, P.C.

(57) ABSTRACT

A shift register unit cascaded in a gate drive circuit, wherein the shift register unit comprises: a control circuit configured to output a control signal, at least two buffer circuits coupled to the control circuit, each of the at least two buffer circuits configured to output scan signal to a gate line. As such, the scan signals output from the at least two buffer circuits
(Continued)

would be synchronized so that the gate lines respectively coupled to the two buffer circuits can be scanned simultaneously.

12 Claims, 9 Drawing Sheets

(52) U.S. Cl.
CPC ............... *G09G 2310/0205* (2013.01); *G09G 2310/0286* (2013.01); *G09G 2310/08* (2013.01); *G09G 2330/023* (2013.01); *G09G 2340/0407* (2013.01)

(56) References Cited

U.S. PATENT DOCUMENTS

| | | | |
|---|---|---|---|
| 2003/0206608 A1 | 11/2003 | Kawahata et al. | |
| 2006/0145999 A1 | 7/2006 | Cho et al. | |
| 2013/0328612 A1 | 12/2013 | Ofuji et al. | |
| 2014/0198022 A1 | 7/2014 | Chou et al. | |
| 2014/0241487 A1* | 8/2014 | Yamazaki | G11C 19/28 |
| | | | 377/54 |
| 2014/0300399 A1* | 10/2014 | Miyake | G11C 19/28 |
| | | | 327/296 |
| 2015/0015474 A1* | 1/2015 | Miyake | H01L 27/1222 |
| | | | 345/100 |
| 2015/0194952 A1 | 7/2015 | Ofuji et al. | |
| 2015/0248867 A1 | 9/2015 | Tan et al. | |
| 2016/0189683 A1* | 6/2016 | Chen | G09G 3/3677 |
| | | | 345/213 |
| 2016/0358666 A1 | 12/2016 | Pang | |
| 2017/0287424 A1 | 10/2017 | Wu et al. | |
| 2018/0025687 A1 | 1/2018 | Wang | |
| 2018/0261177 A1* | 9/2018 | Han | G09G 3/3677 |
| 2019/0057638 A1* | 2/2019 | Kim | G11C 19/28 |

FOREIGN PATENT DOCUMENTS

| | | |
|---|---|---|
| CN | 103927995 A | 7/2014 |
| CN | 104252853 A | 12/2014 |
| CN | 105225625 A | 1/2016 |
| CN | 105243995 A | 1/2016 |
| CN | 105976755 A | 9/2016 |

OTHER PUBLICATIONS

The Partial Supplementary European Search Report in the European Patent Application No. 17866382.9, dated Jun. 9, 2020.
The Extended European Search Report in the European Patent Application No. 17866382.9, dated Sep. 21, 2020.

* cited by examiner

SHIFT REGISTER UNIT, GATE DRIVE CIRCUIT AND METHOD OF DRIVING THE SAME

CROSS-REFERENCE TO RELATED APPLICATION

This application is a national stage application under 35 U.S.C. § 371 of International Application No. PCT/CN2017/108587, filed Oct. 31, 2017, which claims priority of the Chinese Patent Application No. 201710054473.3, entitled "GATE DRIVE CIRCUITS AND METHODS OF DRIVING THE SAME AND ASSOCIATED DISPLAY DEVICES" filed on Jan. 22, 2017, the disclosure of which is incorporated herein by reference in its entirety.

TECHNICAL FIELD

The present disclosure relates in general to a display technology, and more particularly relates to shifter register unit, gate drive circuit, method of driving the same.

BACKGROUND

A display device such as a liquid crystal display (LCD) may include an array substrate and a color film substrate that are paired together. The array substrate may include a number of gate lines and a number of data lines crossing each other at right angles. Each gate line may cross a data line and thus define a subpixel. Therefore, the number and spacing of the gate lines and data lines determine the intrinsic resolution of the display device.

SUMMARY

Embodiments disclosed herein provide shift register unit, gate drive circuit, methods of driving the gate drive circuit, which can enable switching between a plurality of sets of pixel resolutions.

According to one aspect, there is provided a shift register unit cascaded in a gate drive circuit, wherein the shift register unit comprises: a control circuit configured to output a control signal, at least two buffer circuits coupled to the control circuit, one of the at least two buffer circuits configured to output scan signal to a gate line, optionally, the scan signal may be gate scan signal, wherein the control circuit comprises a first pull-up control sub-circuit coupled to a first signal input terminal, a signal output terminal of the control circuit, and a first voltage terminal, the first pull-up control sub-circuit configured to output a signal of the first voltage terminal to the signal output terminal of the control circuit under control of a signal of the first signal input terminal; a first pull-down control sub-circuit coupled to a first clock signal terminal, a second clock signal terminal, the first signal input terminal, a second voltage terminal, a fourth voltage terminal, and a first pull-down node, the first pull-down control sub-circuit configured to control a voltage level of the first pull-down node under control of signals of the first clock signal terminal, the second clock signal terminal and the first signal input terminal; a second pull-down control sub-circuit coupled to the first clock signal terminal, the second clock signal terminal, the first signal input terminal, a third voltage terminal, the fourth voltage terminal, and a second pull-down node, the second pull-down control sub-circuit configured to control a voltage level of the second pull-down node under control of signals of the first clock signal terminal, the second clock signal terminal and the first signal input terminal; a second pull-down sub-circuit coupled to the second pull-down node, the signal output terminal of the control circuit, and the fourth voltage terminal, the second pull-down sub-circuit configured to pull the voltage of the signal output terminal of the control circuit down to the voltage of the fourth voltage terminal under control of a voltage level of the second pull-down node; and a reset sub-circuit coupled to a second signal input terminal, the first voltage terminal, and the second pull-down node, the reset module being configured to output a voltage of the first voltage terminal to the second pull-down node under control of a signal of the second signal input terminal; each of the at least two buffer circuits comprises a second pull-up control sub-circuit coupled to a pull-up control node, the second voltage terminal, the third voltage terminal, and the signal output terminal of the control circuit, the second pull-up control sub-circuit configured to turn on and output a signal of the signal output terminal of the control circuit to the pull-up control node under control of a signal of the second voltage terminal and a signal of the third voltage terminal; a pull-up sub-circuit coupled to the pull-up control node, a third clock signal terminal, and a signal output terminal of the buffer circuit, the pull-up module being configured to output a signal of the third clock signal terminal to the signal output terminal of the buffer circuit under control of a voltage of the pull-up control node; a third pull-down sub-circuit coupled to the first pull-down node, the fourth voltage terminal, and the signal output terminal of the buffer circuit, the third pull-down module being configured to pull a voltage of the signal output terminal of the buffer circuit down to the voltage of the fourth voltage terminal under control of a the first pull-down node; and a fourth pull-down sub-circuit is coupled to the second pull-down node, the fourth voltage terminal, and the signal output terminal of the buffer circuit, the fourth pull-down sub-circuit configured to pull the voltage of the signal output terminal of the buffer circuit down to the voltage of the fourth voltage terminal under control of a voltage level of the second pull-down node.

According to another aspect of the disclosure, there is provided a gate drive circuit, comprising: Q groups of shift register units cascaded in series, one of the Q groups of shift register units cascaded in series comprising S shift register units cascaded in series, each of the S shift register units for outputting scan signals to M gate lines, and S×M clock signal lines, M clock signal lines of which is coupled to one of the S shift register units in each of the Q groups of shift register units, Q, S and M are integer, S≥2, M≥2; wherein each of the S shift register units comprises a control circuit configured to output a control signal, M buffer circuits coupled to the control circuit, and S×M buffer circuits coupled to the S×M clock signal lines for sequentially providing S×M clock signals respectively in one group of the Q groups of shift register units cascaded in series, wherein each of the M buffer circuits is configured to be controlled by the control signal and one of the M clock signals provided by the M clock signal lines to output a scan signal to a gate line of the M gate lines.

According to still another aspect of the disclosure, there is provided a method for driving a gate drive circuit, the gate drive circuit comprises Q groups of shift register units cascaded in series, one of the Q groups of shift register units cascaded in series comprising S shift register units cascaded in series, each of the S shift register units comprises a control circuit configured to output a control signal, M buffer circuits coupled to the control circuit, each of the S shift register units for outputting scan signals to M gate lines, and S×M clock signal lines, M clock signal lines of which is coupled to one of the S shift register units, Q, S and M are integer, S≥2, M≥2; the method comprising: providing S×M clock signals time-sequentially from a 1st clock signal to a S×M-th clock signal through the S×M clock signal lines respectively to the S shift register units in each of the Q groups of shift register units; wherein providing M clock signals through the M clock signal lines to the M buffer circuits in each of the S shift register units.

BRIEF DESCRIPTION OF THE ACCOMPANYING DRAWINGS

To better illustrate the embodiments of the disclosure or the prior art solutions, a brief description of the accompanying drawings for use with the illustration of the embodiments or the prior art is provided below. It is obvious that the drawings described below depict merely some embodiments of the disclosure and those of ordinary skill in the art can obtain other drawings based on the arrangements shown in these drawings without making inventive efforts.

DETAILED DESCRIPTION OF ILLUSTRATED EMBODIMENTS

Figure 1:
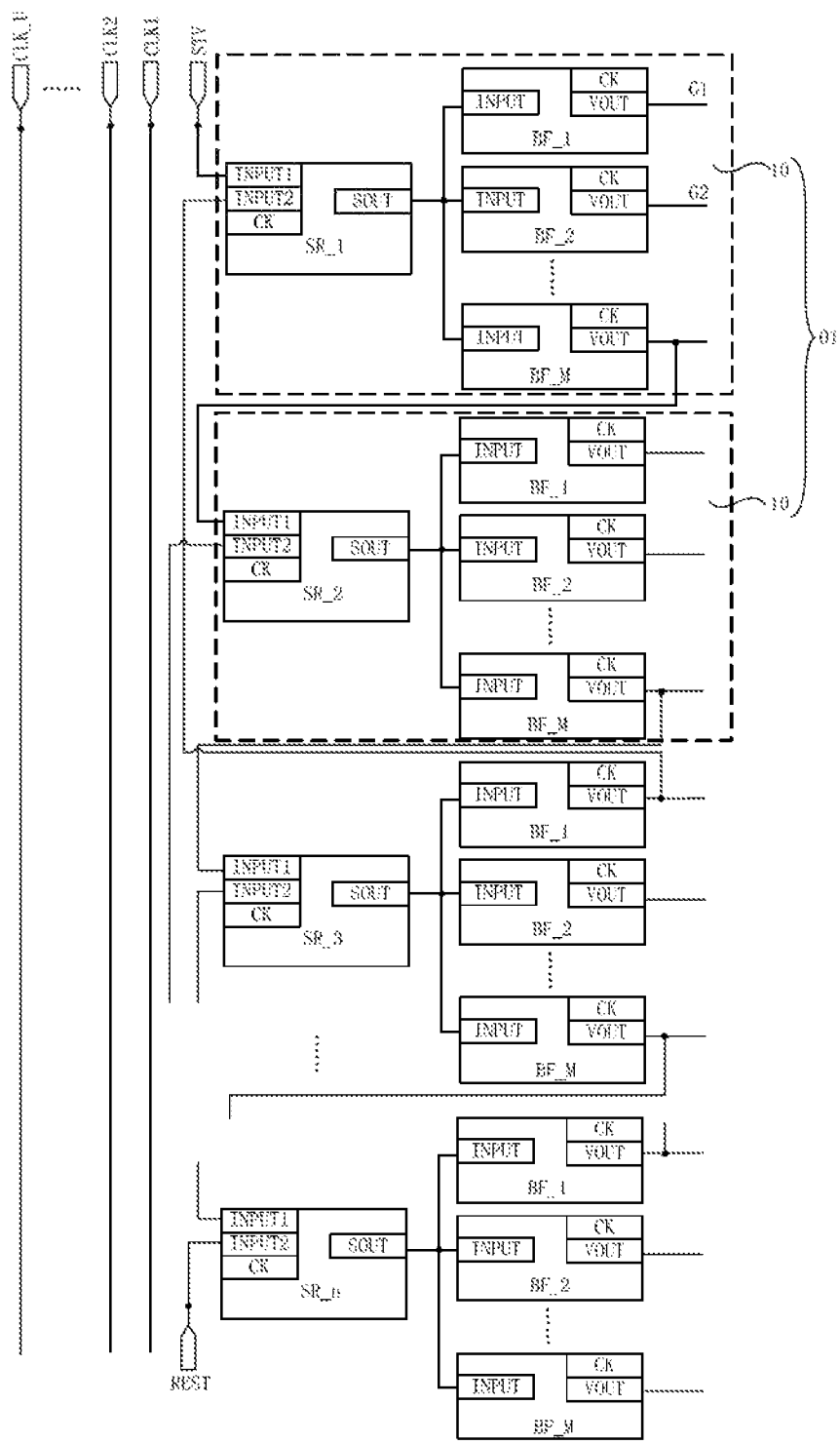
FIG. 1 shows a schematic diagram of a gate drive circuit according to an embodiment of the disclosure.

Hereinafter embodiments of the disclosure will be described in such definite and comprehensive detail with reference made to the accompanying drawings. It is obvious that the embodiments described herein constitute merely part rather than all of the embodiments of the disclosure. Therefore, all other embodiments obtained by those of ordinary skill in the art in light of the embodiments disclosed herein without making inventive efforts shall all fall in the scope of the disclosure.

As the high-definition technology continues to develop, the intrinsic resolution of the display devices have become increasingly higher in order to meet the display requirements for high-definition images. However, when the resolution of the image to be displayed is lower than the intrinsic resolution of the display device, unnecessary display power consumption may be caused if the display still shows the image at its intrinsic resolution.

In one embodiment, there is provided a shift register unit cascaded in a gate drive circuit, wherein the shift register unit comprises: a control circuit configured to output a control signal, at least two buffer circuits coupled to the control circuit, each of the at least two buffer circuits configured to output scan signal to a gate line, wherein the control circuit comprises a first pull-up control sub-circuit coupled to a first signal input terminal, a signal output terminal of the control circuit, and a first voltage terminal, the first pull-up control sub-circuit configured to output a signal of the first voltage terminal to the signal output terminal of the control circuit under control of a signal of the first signal input terminal, a first pull-down control sub-circuit coupled to a first clock signal terminal, a second clock signal terminal, the first signal input terminal, a second voltage terminal, a fourth voltage terminal, and a first pull-down node, the first pull-down control sub-circuit configured to control a voltage level of the first pull-down node under control of signals of the first clock signal terminal, the second clock signal terminal and the first signal input terminal; a second pull-down control sub-circuit coupled to the first clock signal terminal, the second clock signal terminal, the first signal input terminal, a third voltage terminal, the fourth voltage terminal, and a second pull-down node, the second pull-down control sub-circuit configured to control a voltage level of the second pull-down node under control of signals of the first clock signal terminal, the second clock signal terminal and the first signal input terminal; a first pull-down sub-circuit coupled to the first pull-down node, the signal output terminal of the control circuit, and the fourth voltage terminal, the first pull-down sub-circuit configured to pull a voltage at the signal output terminal of the control circuit down to the voltage of the fourth voltage terminal under control of a voltage level of the first pull-down node; a second pull-down sub-circuit coupled to the second pull-down node, the signal output terminal of the control circuit, and the fourth voltage terminal the second pull-down sub-circuit configured to pull the voltage of the signal output terminal of the control circuit down to the voltage of the fourth voltage terminal under control of a voltage level of the second pull-down node; and a reset sub-circuit coupled to a second signal input terminal, the first voltage terminal, and the second pull-down node, the reset module being configured to output a voltage of the first voltage terminal to the second pull-down node under control of a signal of the second signal input terminal, each of the at least two buffer circuits comprises a second pull-up control sub-circuit coupled to a pull-up control node, the second voltage terminal, the third voltage terminal, and the signal output terminal of the control circuit, the second pull-up control sub-circuit configured to turn on and output a signal of the signal output terminal of the control circuit to the pull-up control node under control of a signal of the second voltage terminal and a signal of the third voltage terminal; a pull-up sub-circuit coupled to the pull-up control node, a third clock signal terminal, and a signal output terminal of the buffer circuit, the pull-up module being configured to output a signal of the third clock signal terminal to the signal output terminal of the buffer circuit under control of a voltage of the pull-up control node; a third pull-down sub-circuit coupled to the first pull-down node, the fourth voltage terminal, and the signal output terminal of the buffer circuit, the third pull-down module being configured to pull a voltage of the signal output terminal of the buffer circuit down to the voltage of the fourth voltage terminal under control of a the first pull-down node; and a fourth pull-down sub-circuit is coupled to the second pull-down node, the fourth voltage terminal, and the signal output terminal of the buffer circuit, the fourth pull-down sub-circuit configured to pull the voltage of the signal output terminal of the buffer circuit down to the voltage of the fourth voltage terminal under control of a voltage level of the second pull-down node.

Optionally, the first pull-up control sub-circuit comprises: a first transistor, wherein a gate of the first transistor is coupled to the first signal input terminal, a first electrode of the first transistor is coupled to the first voltage terminal, and a second electrode thereof is coupled to the signal output terminal of the control circuit.

Optionally, the first pull-down control sub-circuit comprises: a second transistor, a third transistor, and a fourth transistor: wherein a gate of the second transistor is coupled to the first clock signal terminal, a first electrode of the second transistor is coupled to the second voltage terminal, and a second electrode thereof is coupled to a first electrode of the third transistor; wherein a gate of the third transistor is coupled to the second clock signal terminal, and a second electrode of the third transistor is coupled to the first pull-down node; and wherein a gate of the fourth transistor is coupled to the first signal input terminal, a first electrode of the fourth transistor is coupled to the fourth voltage terminal, and a second electrode thereof is coupled to the first pull-down node.

Optionally, the second pull-down control sub-circuit comprises a fifth transistor, a sixth transistor, and a seventh transistor: wherein a gate of the fifth transistor is coupled to the first clock signal terminal, a first electrode of the fifth transistor is coupled to the third voltage terminal, and a second electrode thereof is coupled to a first electrode of the sixth transistor; wherein a gate of the sixth transistor is coupled to the second clock signal terminal, and a second electrode of the sixth transistor is coupled to the second pull-down node; and wherein a gate of the seventh transistor is coupled to the first signal input terminal, a first electrode of the seventh transistor is coupled to the fourth voltage terminal, and a second electrode thereof is coupled to the second pull-down node.

Optionally, the first pull-down sub-circuit comprises: an eighth transistor, wherein a gate of the eighth transistor is coupled to the first pull-down node, a first electrode of the eighth transistor is coupled to the fourth voltage terminal, and a second electrode thereof is coupled to the signal output terminal of the control circuit.

Optionally, the second pull-down module comprises: a ninth transistor, wherein a gate of the ninth transistor is coupled to the second pull-down node, a first electrode of the ninth transistor is coupled to the fourth voltage terminal, and a first second electrode thereof is coupled to the signal output terminal of the control circuit.

Optionally, the reset module comprises: a tenth transistor, where a gate of the tenth transistor is coupled to the second signal input terminal, a first electrode of the tenth transistor is coupled to the first voltage terminal, and a second electrode thereof is coupled to the second pull-down node.

Optionally, the second pull-up control sub-circuit comprises an eleventh transistor and a twelfth transistor; wherein a gate of the eleventh transistor is coupled to the third voltage terminal, a first electrode of the eleventh transistor is coupled to the signal output terminal of the control circuit, and a second electrode thereof is coupled to the pull-up control node; and wherein a gate of the twelfth transistor is coupled to the second voltage terminal, a first electrode of the twelfth transistor is coupled to the signal output terminal of the control circuit, and a second electrode thereof is coupled to the pull-up control node.

Optionally, the pull-up sub-circuit comprises a thirteenth transistor and a storage capacitor; wherein a gate of the thirteenth transistor is coupled to the pull-up control node, a first electrode of the thirteen transistor is coupled to the third clock signal terminal, and a second electrode thereof is coupled to the signal output terminal of the buffer circuit: and wherein one terminal of the storage capacitor is coupled to the gate of the thirteenth transistor, and another terminal thereof is coupled to the second electrode of the thirteenth transistor.

Optionally, the third pull-down sub-circuit comprises: a fourteenth transistor, wherein a gate of the fourteenth transistor is coupled to the first pull-down node, a first electrode of the fourteenth transistor is coupled to the fourth voltage terminal, and a second electrode thereof is coupled to the signal output terminal of the buffer circuit.

Optionally, the fourth pull-down sub-circuit comprises: a fifteenth transistor, wherein a gate of the fifteenth transistor is coupled to the second pull-down node, a first electrode of the fifteenth transistor is coupled to the fourth voltage terminal, and a second electrode thereof is coupled to the signal output terminal of the buffer circuit.

In another embodiment, there is provided a gate drive circuit, comprising: Q groups of shift register units cascaded in series, one of the Q groups of shift register units cascaded in series comprising S shift register units cascaded in series, each of the S shift register units for outputting scan signals to M gate lines, and S×M clock signal lines, M clock signal lines of which is coupled to one of the S shift register units in each of the Q groups of shift register units, Q, S and M are integer, S≥2, M≥2; wherein each of the S shift register units comprises a control circuit configured to output a control signal, M buffer circuits coupled to the control circuit, and S×M buffer circuits coupled to the S×M clock signal lines for sequentially providing S×M clock signals respectively in one group of the Q groups of shift register units cascaded in series, wherein each of the M buffer circuits is configured to be controlled by the control signal and one of the M clock signals provided by the M clock signal lines to output a scan signal to a gate line of the M gate lines.

Optionally, the S×M clock signals sequentially from $1^{st}$ clock signal to the S×M-th clock signal are provided with a time-delay between any pair of subsequent clock signals.

Optionally, the time-delay equals to 1/S×M of one period of each clock signal.

Optionally, the S×M clock signals sequentially from 1st clock signal to the S×M-th clock signal comprise a plurality of groups of clock signals, a time-delay is provided between two time-sequential groups of clock signals of the plurality of groups of clock signals, and clock signals in each of the plurality of groups of clock signals are in phase.

Optionally, each of the plurality of groups of clock signals comprises two clock signals of the S×M clock signals.

Optionally, each of the plurality of groups of clock signals comprises four clock signals of the S×M clock signals.

Optionally, wherein S=3, Q=4.

Optionally, wherein S=4, Q=2.

As shown in Figs, there is provided a gate drive circuit for outputting scan signals to the gate lines (G1, G2, . . . ). The gate drive circuit may include a number of N cascaded shift register units 10, as shown in FIG. 1. Every number of S successive cascaded shift register units 10 may constitute a drive group 01, and in the example shown in FIG. 1 two shift register units 10 constitute a drive group 01, where N>S≥1 and both N and S are positive integers.

In particular, each shift register unit 10 may include a control circuit SR and at least two buffer circuits BF coupled to the control circuit SR. A signal output terminal VOUT of each buffer circuit BF may be coupled to a row of gate line which is labeled Gate. Each shift register unit 10 may include a number of M buffer circuits (BF_1, BF_2 . . . BF_M), where M≥2 and M is a positive integer.

The clock signal terminals CK of every two buffer circuits BF in the same drive group 01 may be coupled to different system clock signal terminals (CLK1, CLK2, . . . or CLK-U, where U≥2 and U is a positive integer). As such, in a forward scan mode for example, when different signals are input from the above system clock signal terminals (CLK1, CLK2, . . . , CLK-U), the gate scan signals output from top to bottom by the buffer circuits BF in the same drive group 01 in turn may constitute a certain phase difference so that the gate lines coupled to the respective buffer circuits BF in the same drive group 01 can be turned on in a line-by-line manner.

Alternatively, when at least two of the above system clock signal terminals (CLK1, CLK2, . . . , CLK-U) that are coupled to the buffer circuits BF supply the same clock signals, the clock signal terminals CK of at least two buffer circuits BF in the same drive group 01 may receive the same clock signals. Thus, the gate scan signals output from the signal output terminals VOUT of the above at least two buffer circuits BF may be synchronized so that the gate lines respectively coupled to the above at least two buffer circuits BF can be scanned simultaneously.

In addition, the clock signal terminals of the control circuit SR and those of the buffer circuits BF in the same shift register unit 10 may be coupled to different system clock signal terminals so that the input signals to the first signal terminal INPUT1 and to the second signal terminal INPUT2 of the control circuit SR may both constitute a phase difference from the output signals of the signal output terminals VOUT of the buffer circuits BF, thereby achieving the shift register of the gate scan signals.

Further, the N shift register units 10 may be cascaded with each other to form the gate drive circuit according to the following cascade mode. A first signal input terminal INPUT1 of the control circuit SR of the first stage shift register unit 10 may be coupled to a start signal terminal STV. The start signal terminal STV may be configured to input a start signal to drive the gate drive circuit to enter an operating state. Aside from the first stage shift register unit 10, the first signal input terminal INPUT1 of the control circuit SR of each of the other shift register units 10 may be coupled to the signal output terminal VOUT of a buffer circuit BF of the (N−1)th stage shift register unit 10, where N represents a variable denoting the instant stage shift register unit 10 and (N−1) denotes the immediate previous stage shift register unit 10.

Namely, the gate scan signal output from the signal output terminal VOUT of the buffer circuit BF of the previous stage shift register unit 10 may serve as the input signal of the control circuit SR of the next stage shift register unit 10.

Furthermore, the second signal input terminal INPUT2 of the control circuit SR of each shift register unit 10 may be coupled to the signal output terminal of a buffer circuit BF of the (N+2)th stage shift register unit 10 except for the last two stages of shift register units 10, where N represents a variable denoting the instant stage shift register unit 10 and (N+2) denotes the later stage shift register unit 10 that is 2 stages from the instant stage.

Meanwhile, the second signal input terminal INPUT2 of either of the control circuits SR of the last two stages of shift register units 10 may be coupled to a reset signal terminal REST. The reset signal terminal REST may be configured to output a reset signal to reset the last two stages of shift register units 10.

Simply put, each shift register unit includes a control circuit and at least two buffer circuits coupled to the control circuit, and the clock signal terminals of every two buffer circuits in the same drive group are coupled to different system clock signal terminals, and those of the control circuit and of the buffer circuits in the same shift register unit are coupled to different system clock signal terminals. Thus, the clock signal terminals of every two buffer circuits in each drive group can be made to receive different clock signals when the resolution of the picture to be displayed is equivalent to the intrinsic resolution of the display device. As such, a start signal may be fed to the start signal terminal, and the gate scan signals sequentially output from the signal output terminals of the buffer circuits from top to bottom in turn may constitute a certain phase difference, so that all rows of gate lines can be scanned progressively. Therefore, the display device employing the gate drive circuit can display contents at its intrinsic resolution.

Alternatively, if the resolution of the picture to be displayed is lower than the intrinsic resolution of the display device, the clock signal terminals of at least two buffer circuits in any one of the shift register units can be made to receive the same clock signals. As such, the gate scan signals output from the signal output terminals of the above at least two buffer circuits may be synchronized so that the gate lines respectively coupled to the two buffer circuits can be scanned simultaneously. Hence, the display device employing the gate drive circuit can display a picture at a resolution lower than its intrinsic resolution, leading to the purpose of reducing the display power consumption.

In the case where the resolution of the picture to be displayed is lower than the intrinsic resolution of the display device, a detailed description is provided below as to the specific structure of the gate drive circuit used to convert the resolution of the display device, where the intrinsic resolution of the display device as described above is 8K for example.

In this embodiment, the display device employing the above gate drive circuit has an intrinsic resolution of 8K, and the display device also can convert its resolution from 8K to 4K or from 8K to 2K.

Figure 2:
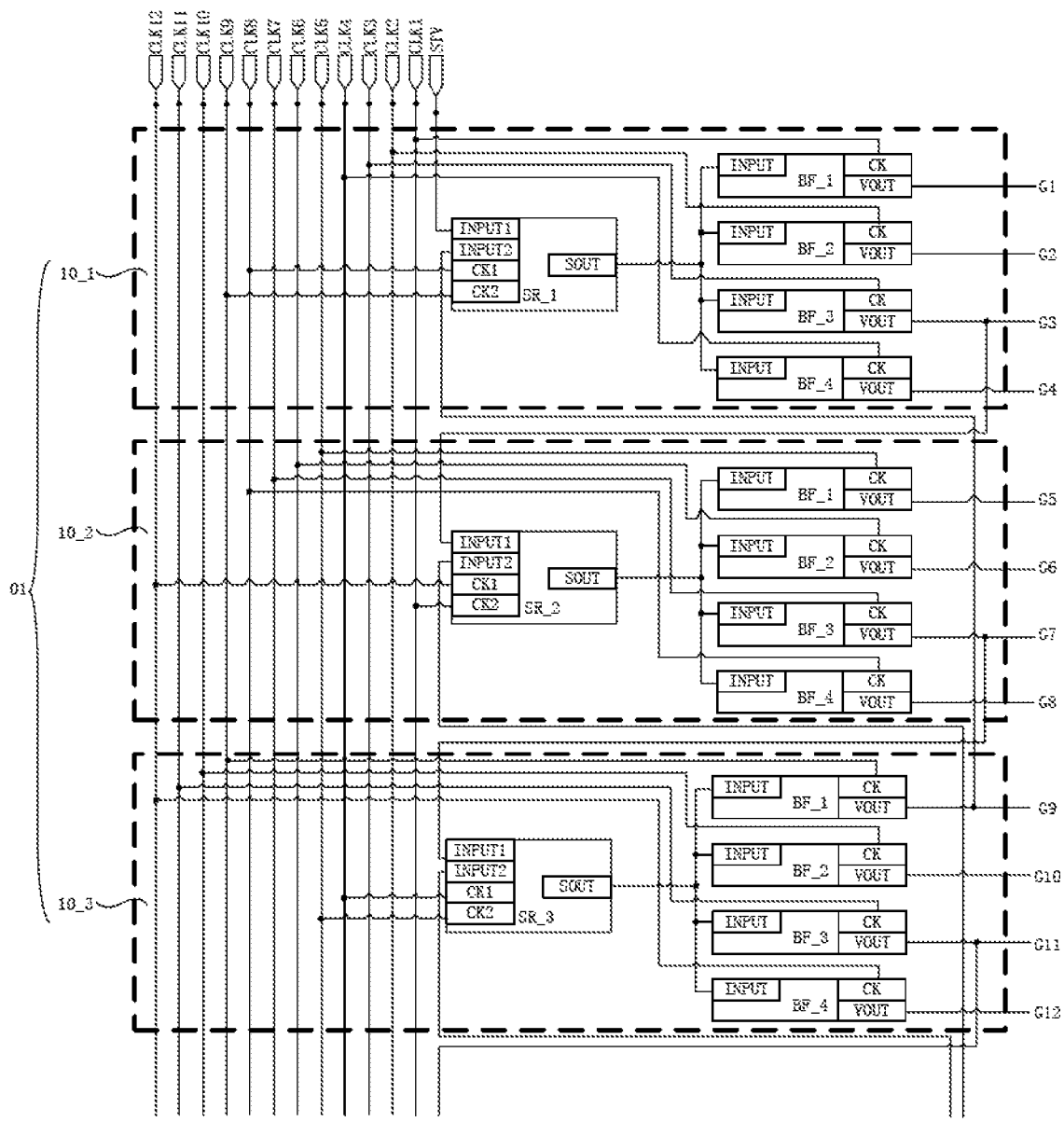
FIG. 2 shows a schematic diagram illustrating an example of a gate drive circuit of FIG. 1 in which each shift register unit includes four buffer circuits.

Each drive group 01 of the gate drive circuit may be coupled to a number of 12 gate lines. As shown in FIG. 2, each of the drive groups 01 may include a first shift register unit 10_1, a second shift register unit 10_2, and a third shift register unit 10_3 successively cascaded.

Each of first shift register unit 10_1, the second shift register unit 10_2, and the third shift register unit 10_3 may include a first buffer circuit BF_1, a second buffer circuit BF_2, a third buffer circuit BF_3, and a fourth buffer circuit BF_4.

The clock signal terminals CK of the first buffer circuit BF_1, the second buffer circuit BF_2, the third buffer circuit BF_3, and the fourth buffer circuit BF_4 in the first shift register unit 10_1 may be coupled to a first system clock signal CLK1, a second system clock signal CLK2, a third system clock signal CLK3, and a fourth system clock signal CLK4, respectively.

The clock signal terminals CK of the first buffer circuit BF_1, the second buffer circuit BF_2, the third buffer circuit BF_3, and the fourth buffer circuit BF_4 in the second shift register unit 10_2 may be coupled to a fifth system clock signal CLK5, a sixth system clock signal CLK6, a seventh system clock signal CLK7, and an eighth system clock signal CLK5, respectively.

The clock signal terminals CK of the first buffer circuit BF_1, the second buffer circuit BF_2, the third buffer circuit BF_3, and the fourth buffer circuit BF_4 in the third shift register unit 10_3 may be coupled to a ninth system clock signal CLK9, a tenth system clock signal CLK10, an eleventh system clock signal CLK11, and a twelfth system clock signal CLK12, respectively.

The control circuit SR of each of the first shift register unit 10_1, the second shift register unit 10_2, and the third shift register unit 10_3 may have two clock signal terminals, i.e., a first clock signal terminal CK1 and a second clock signal terminal CK2.

The first clock signal terminal CK1 and the second clock signal terminal CK2 of the control circuit SR in the first shift register unit 10_1 may be coupled to the eighth system clock signal terminal CLK8 and the ninth system clock signal terminal CLK9, respectively. The first clock signal terminal CK1 and the second clock signal terminal CK2 of the control circuit SR in the second shift register unit 10_2 may be coupled to the twelfth system clock signal terminal CLK12 and the first system clock signal terminal CLK1, respectively. The first clock signal terminal CK1 and the second clock signal terminal CK2 of the control circuit SR in the third shift register unit 10_3 may be coupled to the fourth system clock signal terminal CLK4 and the fifth system clock signal terminal CLK5, respectively.

As described above, each one of the first shift register unit 10_1, the second shift register unit 10_2, and the third shift register unit 10_3 is coupled to a sequence of four gate lines. Therefore, adopting the signal timing shown in FIG. 3, the clock signals input from the first system clock signal terminal CLK1, the second system clock signal terminal CLK2, the third system clock signal terminal CLK3, the fourth system clock signal terminal CLK4, the fifth system clock signal terminal CLK5, the sixth system clock signal terminal CLK6, the seventh system clock signal terminal CLK7, the eighth system clock signal terminal CLK8, the ninth system clock signal terminal CLK9, the tenth system clock signal terminal CLK0, the eleventh clock signal terminal CLK11, and the twelfth system clock signal terminal CLK12 in turn may constitute a certain phase difference.

Figure 3:
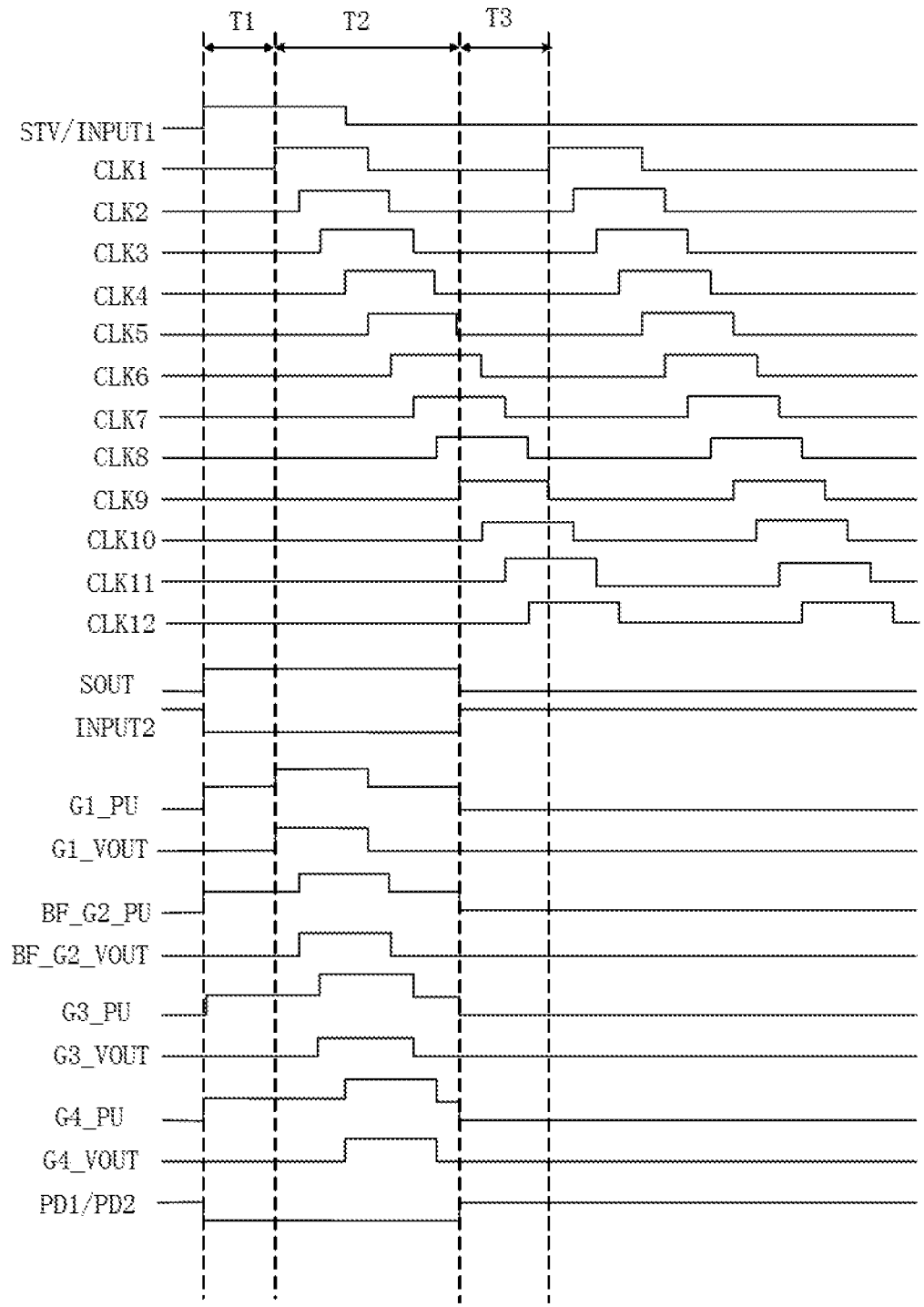
FIG. 3 shows a timing diagram of the control signal used by the gate drive circuit of FIG. 2 when the intrinsic resolution is displayed.

Note, the phase difference mentioned above can be set according to actual needs of the user. As shown in FIG. 3, for example, when the high level duration of the clock signal is 5H, the time difference between two adjacent clock signals may be 1H while the overlap portion may be 4H, where H represents the scan duration of one row of pixels, namely the ratio of the scan duration of one image frame to the total number of gate lines.

For example, with reference to the drive group 01 coupled to the gate lines (G1-G12), the signal output terminal VOUT of the first buffer circuit BF_1 of the first shift register unit 10_1 that is coupled to the first system clock signal terminal CLK1 may output a gate scan signal to gate line G1. Next, gate lines G2-G12 may sequentially receive gate scan signals output from their respective coupled output terminals VOUT of the buffer circuits. Thus, the above gate lines G1 to G12 can be scanned line by line.

Furthermore, since from top to bottom the last shift register unit 10 in the previous drive group 01 is cascaded with the first shift register unit 10 in the next drive group 01, the above mentioned phase difference also may be present between the output gate scan signal of the signal output terminal VOUT of the last buffer circuit of the last shift register unit 10 in the previous drive group 01 and that of the signal output terminal VOUT of the first buffer circuit of the first shift register unit 10 in the next drive group 01. Thus, when the forward scan mode is adopted, the scan signals would be sequentially input to the gate lines from top to bottom, and so the subpixels can be turned on in a line-by-line manner, leading to a full display of the picture. In this case, the display device having the above-described gate drive circuit can display at its intrinsic resolution, since all rows of subpixels are switched on a line-by-line basis. That is, when the above intrinsic resolution is 8K and the timing signal as shown in FIG. 3 is adopted, the display device may display the picture at 8K resolution.

Figure 4:
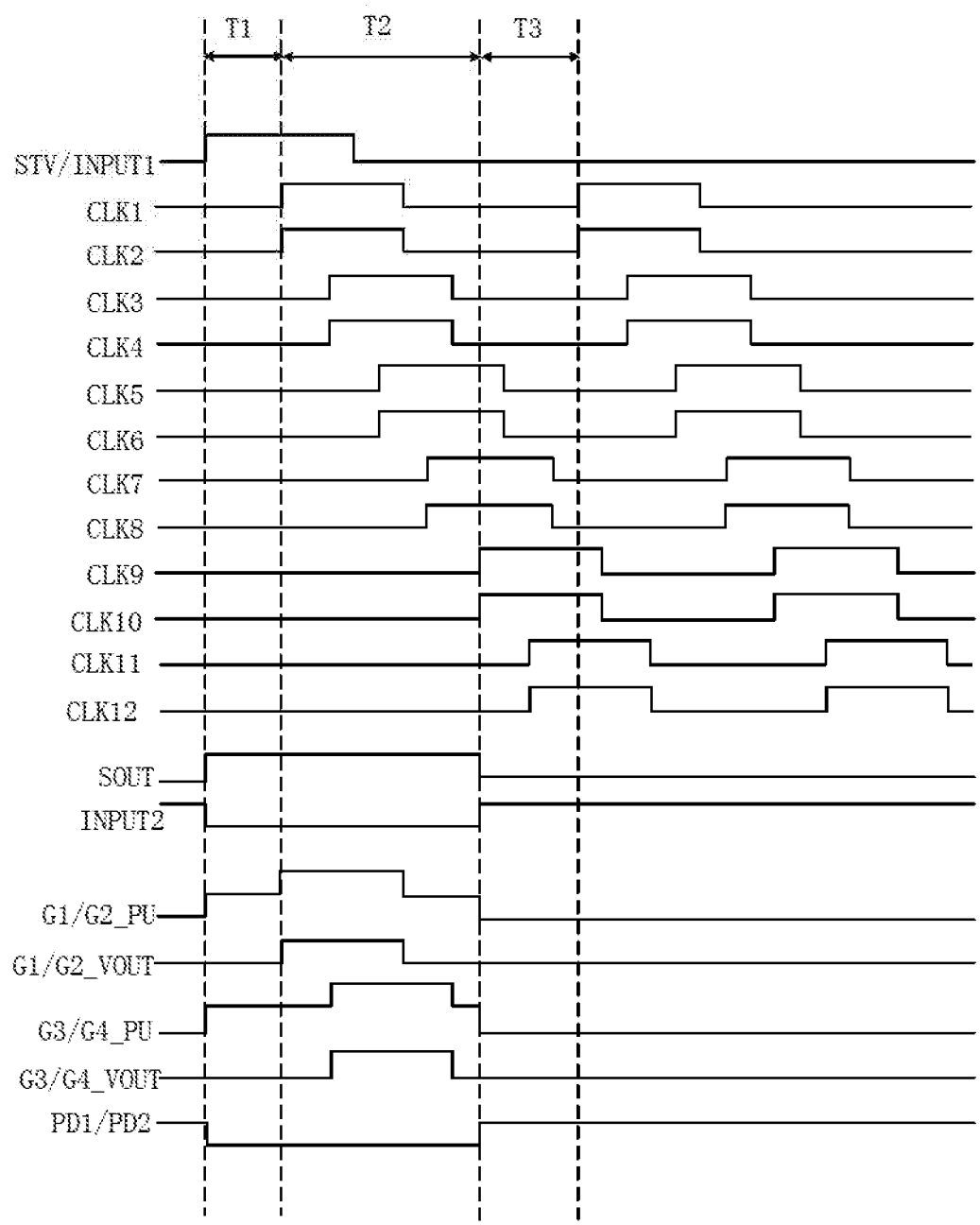
FIG. 4 shows a timing diagram of the control signal used by the gate drive circuit of FIG. 2 when a half of the intrinsic resolution is displayed.

Alternatively, to make the display device display at 4K resolution, the timing signal as shown in FIG. 4 may be used. The clock signals input from the first system clock signal terminal CLK1, the third system clock signal terminal CLK3, the fifth system clock signal terminal CLK5, the seventh system clock signal terminal CLK7, the ninth system clock signal terminal CLK9, and the eleventh system clock signal terminal CLK11 in turn may constitute a certain phase difference. As shown in FIG. 4, for example, when the high level duration of the clock signal is 5H, the time difference between two adjacent different clock signals may be 2H while the overlap portion may be 3H.

The output signal of the first system clock signal CLK1 may be the same as that of the second system clock signal terminal CLK2. The output signal of the third system clock signal terminal CLK3 may be the same as that of the fourth system clock signal terminal CLK4. The output signal of the fifth system clock signal terminal CLK5 may be the same as that of the sixth system clock signal terminal CLK6. The output signal of the seventh system clock signal terminal CLK7 may be the same as that of the eighth system clock signal terminal CLK8. The output signal of the ninth system clock signal terminal CLK9 may be the same as that of the tenth system clock signal terminal CLK10. The output signal of the eleventh system clock signal terminal CLK11 may be the same as that of the twelfth system clock signal terminal CLK12.

Thus, with respect to the drive group 01 coupled to the gate lines (G1-G12), gate lines G1 and G2 may receive their gate scan signals simultaneously. Likewise, gate lines G3 and G4 may receive their gate scan signals simultaneously; G5 and G6 may receive their gate scan signals simultaneously: G7 and G8 may receive their gate scan signals simultaneously: G9 and G10 may receive their gate scan signals simultaneously; and G11 and G12 may receive their gate scan signals simultaneously. Accordingly, for the entire army substrate under the forward scan mode for example, every two successive rows of sub-pixels arranged in order from top to bottom may be switched on simultaneously, and every two sub-pixels which spread in these two rows and are located in one same column may receive the same data signal and so may display the same greyscale. As a result, the display device having the above-described gate drive circuit may display a resolution of one-half of the intrinsic resolution 8K, i.e., 4K.

Figure 5:
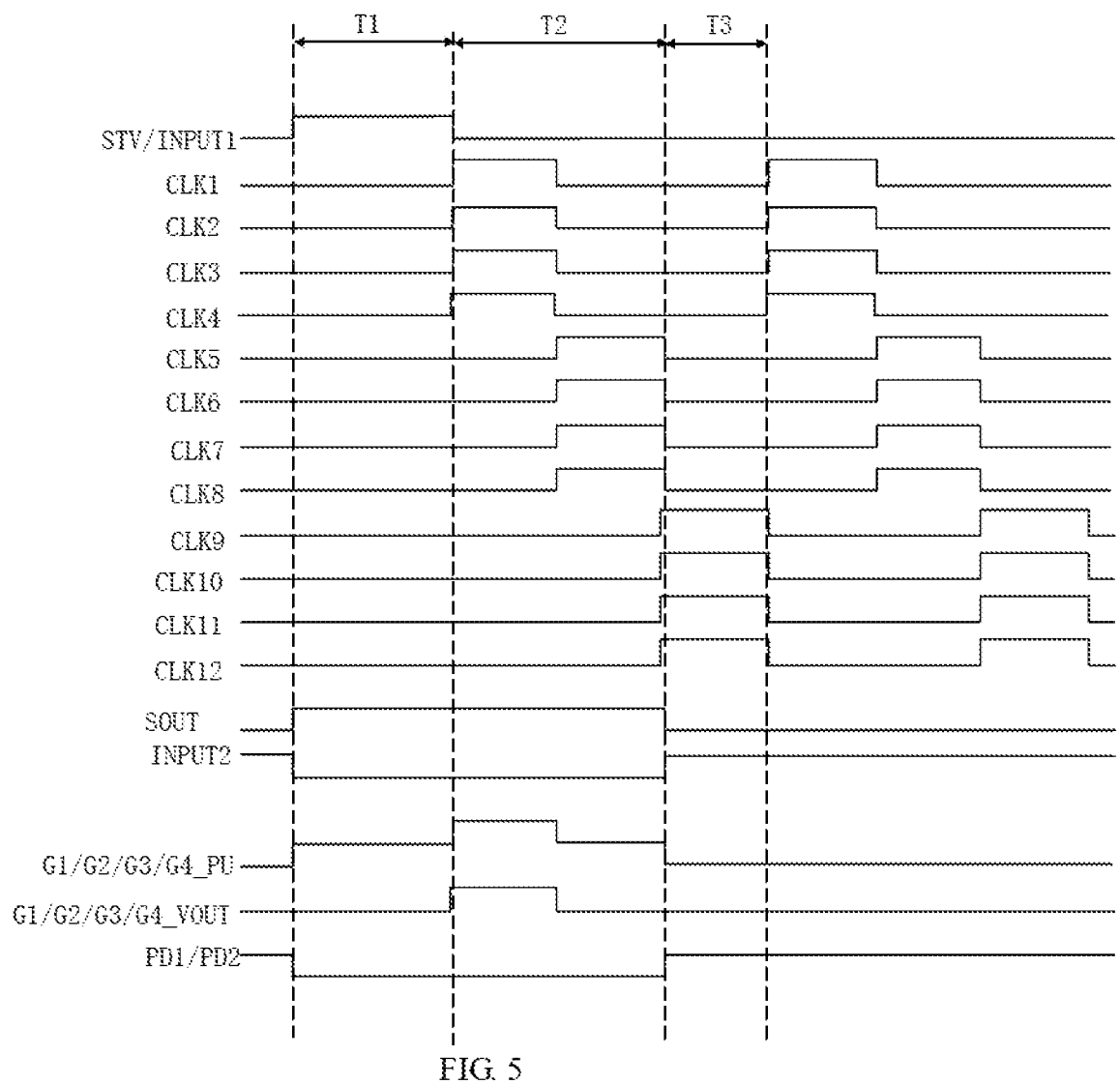
FIG. 5 shows a timing diagram of the control signal of used by gate drive circuit of FIG. 2 when a quarter of the intrinsic resolution is displayed.

Alternatively, in order to further reduce the resolution so that the display device can convert to a 2K resolution, a timing signal as shown in FIG. 5 may be used. The clock signals input from the first system clock signal terminal CLK1, the fifth system clock signal terminal CLK5, and the ninth system clock signal terminal CLK9 in turn may constitute a certain phase difference. As shown in FIG. 5, for example, when the high level duration of the clock signal is 5H, the time difference between two adjacent different clock signals may be 5H while there is no overlap.

As such, the output signals of the first system clock signal terminal CLK1, the second system clock signal terminal CLK2, the third system clock signal terminal CLK3, and the fourth system clock signal terminal CLK4 may be the same as one another. The fifth system clock signal terminal CLK5, the sixth system clock signal terminal, the seventh system clock signal terminal CLK7, and the eighth system clock signal terminal CLK8 may output the same signals. Likewise, the output signals of the ninth system clock signal terminal CLK9, the tenth system clock signal terminal CLK10, the eleventh system clock signal terminal CLK11, and the twelfth system clock signal terminal CLK12 may be the same as each other.

Thus, with respect to the drive group 01 coupled to the gate lines (G1-G12), gate lines G1, G2. G3, and G4 may receive their gate scan signals simultaneously, gate lines G5, G6, G7, and G8 may receive their gate scan signals simultaneously, and, likewise, gate lines G9, G10, G11, and G12 may receive their gate scan signals simultaneously. Accordingly, for the entire array substrate under the forward scan mode for example, every four successive rows of sub-pixels arranged in order from top to bottom may be turned on simultaneously, and every four sub-pixels that spread among these four rows respectively and that are located in one same column may receive the same data signal and so may display the same greyscale. As a result, the display device having the above-described gate drive circuit may display a resolution of one quarter of the intrinsic resolution 8K, i.e., 2K.

As described above, the display device having the gate drive circuit would be able to convert its display resolution from the intrinsic resolution 8K to 4K or from 8K to 2K, by controlling the output signals of the system clock signal terminals. Thus, when the resolution of the picture to be displayed is lower than its intrinsic resolution, the display device can display the screen at a resolution of 4K or 2K so as to reduce the power consumption.

In this embodiment, the display device employing the above gate drive circuit can convert its resolution from the intrinsic resolution 8K to 4K.

Figure 6:
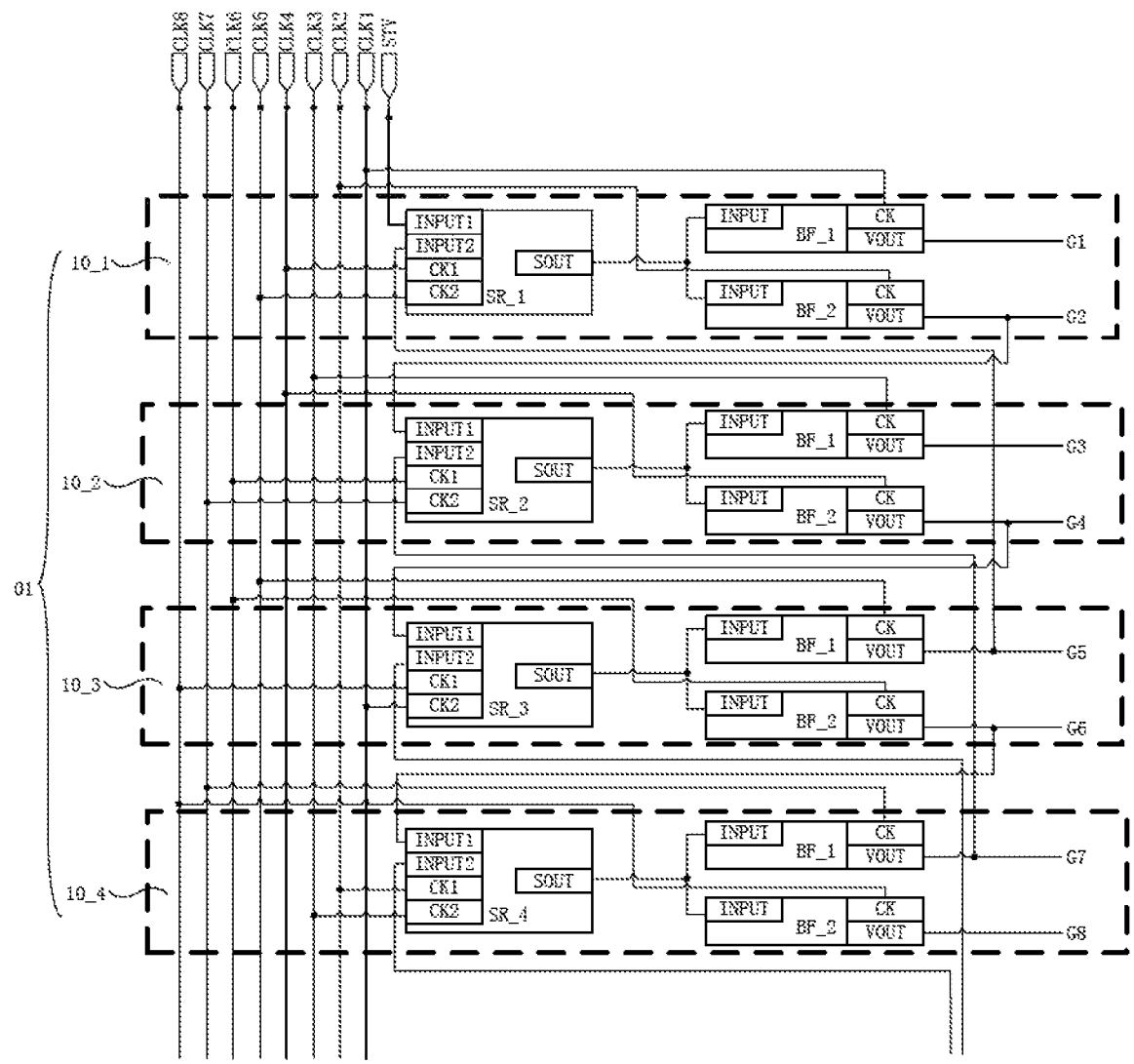
FIG. 6 shows a schematic diagram illustrating an example of a gate drive circuit of FIG. 1 in which each shift register unit includes two buffer circuits.

Each drive group 01 of the gate drive circuit may be coupled to a number of 8 gate lines. Referring now to FIG. 6, each of the drive groups 01 as described above may include a first shift register unit 10_1, a second shift register unit 10_2, a third shift register unit 10_3, and a fourth shift register unit 10_4 cascaded successively.

Each of first shift register unit 10_1, the second shift register unit 10_2, the third shift register unit 10_3, and the fourth shift register unit 10_4 may include a first buffer circuit BF_1 and a second buffer circuit BF_2.

The clock signal terminals CK of the first buffer circuit BF_1 and the second buffer circuit BF_2 in the first shift register unit 10_1 may be coupled to a first system clock signal terminal CLK1 and a second system clock signal terminal CLK2, respectively.

The clock signal terminals CK of the first buffer circuit BF_1 and the second buffer circuit BF_2 in the second shift register unit 10_2 may be coupled to a third system clock signal terminal CLK3 and a fourth system clock signal terminal CLK4, respectively.

The clock signal terminals CK of the first buffer circuit BF_1 and the second buffer circuit BF_2 in the third shift register unit 10_3 may be coupled to a fifth system clock signal terminal CLK5 and a sixth system clock signal terminal CLK6, respectively.

The clock signal terminals CK of the first buffer circuit BF_1 and the second buffer circuit BF_2 in the fourth shift register unit 104 may be coupled to a seventh system clock signal terminal CLK7 and an eighth system clock signal terminal CLK8, respectively.

The control circuit SR of each of the first shift register unit 10_1, the second shift register unit 10_2, and the third shift register unit 10_3 may have two clock signal terminals, i.e., a first clock signal terminal CK1 and a second clock signal terminal CK2.

The first clock signal terminal CK1 and the second clock signal terminal CK2 of the control circuit SR in the first shift register unit 10_1 may be coupled to the fourth system clock signal terminal CLK4 and the fifth system clock signal terminal CLK5, respectively. The first clock signal terminal CK1 and the second clock signal terminal CK2 of the control circuit SR in the second shift register unit 10_2 may be coupled to the sixth system clock signal terminal CLK6 and the seventh system clock signal terminal CLK7, respectively. The first clock signal terminal CK1 and the second clock signal terminal CK2 of the control circuit SR in the third shift register unit 10_3 may be coupled to the eighth system clock signal terminal CLK8 and the first system clock signal terminal CLK1, respectively. And, the control circuit SR of the fourth shift register unit 10_4 may be coupled to the second system clock signal terminal CLK2 and the third system clock signal terminal CLK3, respectively.

As described above, each one of the first shift register unit 10_1, the second shift register unit 10_2, the third shift register unit 10_3, and the fourth shift register unit 10_4 is coupled to a consecutive sequence of two gate lines. Therefore, adopting the clock signal timing shown in FIG. 7, the clock signals input from the first system clock signal terminal CLK1, the second system clock signal terminal CLK2, the third system clock signal terminal CLK3, the fourth system clock signal terminal CLK4, the fifth system clock signal terminal CLK5, the sixth system clock signal terminal CLK6, the seventh system clock signal terminal CLK7, and the eighth system clock signal terminal CLK8 in turn may constitute a certain phase difference.

For example, with respect to the drive group 01 coupled to the gate lines (G1-G8), the signal output terminal VOUT of the first buffer circuit BF_1 in the first shift register unit 10_1 that is coupled to the first system clock signal terminal CLK1 may output a gate scan signal to gate line G1. Next, gate lines G2-G8 may sequentially receive their gate scan signals output from their respective coupled output terminals VOUT of the buffer circuits. Thus, the above gate lines G1 to G8 can be scanned line by line.

Figure 7:
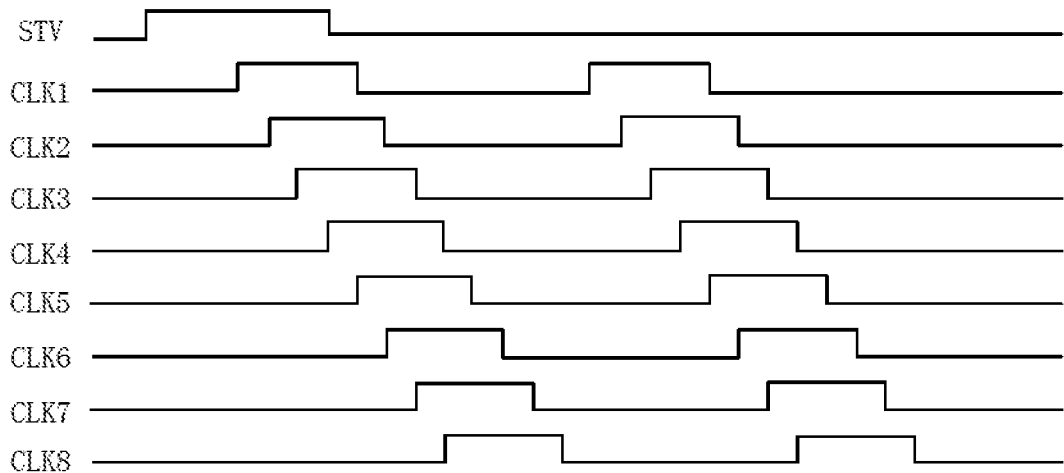
FIG. 7 shows a timing diagram of the control signal used by the gate drive circuit of FIG. 6 when the intrinsic resolution is displayed.

In the same manner as in Embodiment 1, the above phase difference also may be present between the output gate scan signal of the signal output terminal VOUT of the last buffer circuit of the last shift register unit 10 in the previous drive group 01 and that of the signal output terminal VOUT of the first buffer circuit of the first shift register unit 10 in the next drive group 01. Thus, when the forward scan mode is adopted, the scan signals may sequentially be input to the gate lines from top to bottom, and so the subpixels can be switched on in a line-by-line manner, leading to a fill display of the picture. In this case, the display device having the above-described gate drive circuit can display at its intrinsic resolution, since all rows of subpixels are switched on line by line. That is, when the above intrinsic resolution is 8K and the timing signal as shown in FIG. 7 is adopted, the display device may display the picture at the 8K resolution.

Figure 8:
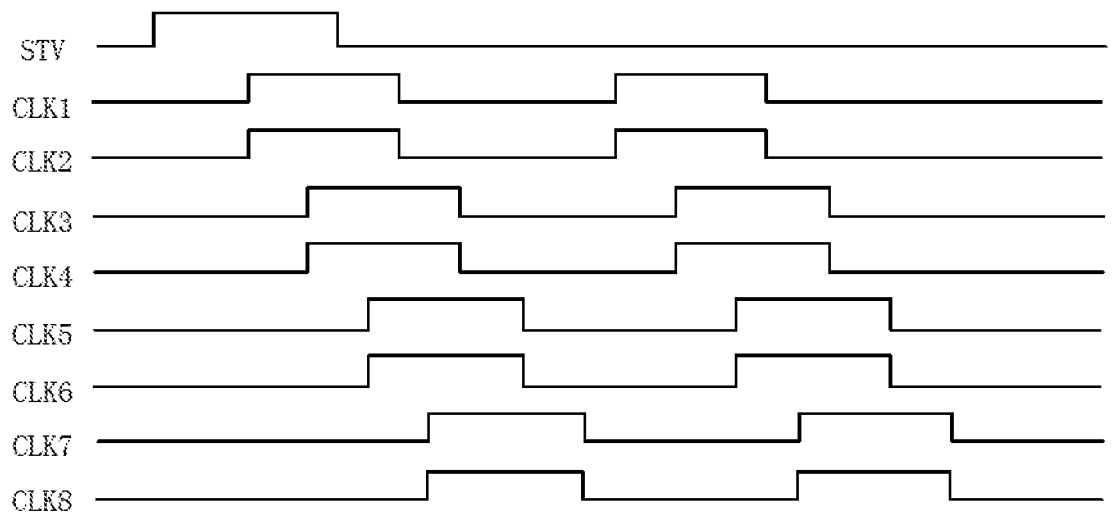
FIG. 8 shows a timing diagram of the control signal used by the gate drive circuit of FIG. 6 when a half of the intrinsic resolution is displayed.

Alternatively, to make the display device display at 4K resolution, the timing signal as shown in FIG. 8 may be used. Accordingly, the output clock signals of the first system clock signal terminal CLK1, the third system clock signal terminal CLK3, the fifth system clock signal terminal CLK5, and the seventh system clock signal terminal CLK7 in turn may constitute a certain phase difference.

The output signal of the first system clock signal CLK1 may be the same as that of the second system clock signal terminal CLK2. The output signal of the third system clock signal terminal CLK3 may be the same as that of the fourth system clock signal terminal CLK4. The output signal of the fifth system clock signal terminal CLK5 may be the same as that of the sixth system clock signal terminal CLK6. The output signal of the seventh system clock signal terminal CLK7 may be the same as that of the eighth system clock signal terminal CLK8.

Thus, with respect to the drive group 01 coupled to the gate lines (G1-G8), gate lines G1 and G2 may receive their gate scan signals simultaneously. Likewise, gate lines G3 and G4 may receive their gate scan signals simultaneously; G5 and G6 may receive their gate scan signals simultaneously; and G7 and G8 may receive their gate scan signals simultaneously. Accordingly, for the entire array substrate under the forward scan mode for example, every two successive rows of sub-pixels arranged in order from top to bottom may be switched on simultaneously, and every two sub-pixels which spread in these two rows respectively and are located in one same column may receive the same data signal and so may display the same greyscale. As a result, the display device having the above-described gate drive circuit may display a resolution of one-half of the intrinsic resolution 8K, i.e., 4K.

It is noteworthy that if the intrinsic resolution is 4K and the timing signal as shown in FIG. 7 is used for display, the display device may display the screen at the resolution of 4K. Otherwise, when the timing signal as shown in FIG. 8 is used for display, the display device may display at the resolution of 2K.

Comparing the gate drive circuit provided by the example as illustrated in FIG. 6 to that provided by the example as shown in FIG. 2, it can be seen that in the solution of FIG. 6 one control circuit SR is coupled to a comparatively less number of buffer circuits BF, so that the wiring space of the non-display area can be reduced, which is advantageous to satisfying the design requirements of ultra-narrow frame.

Hereinafter, the specific configuration of the control circuit SR and the buffer circuit BF in any one of the shift register units 01 shown in FIG. 2 or FIG. 6 will be described in greater detail.

Figure 9:
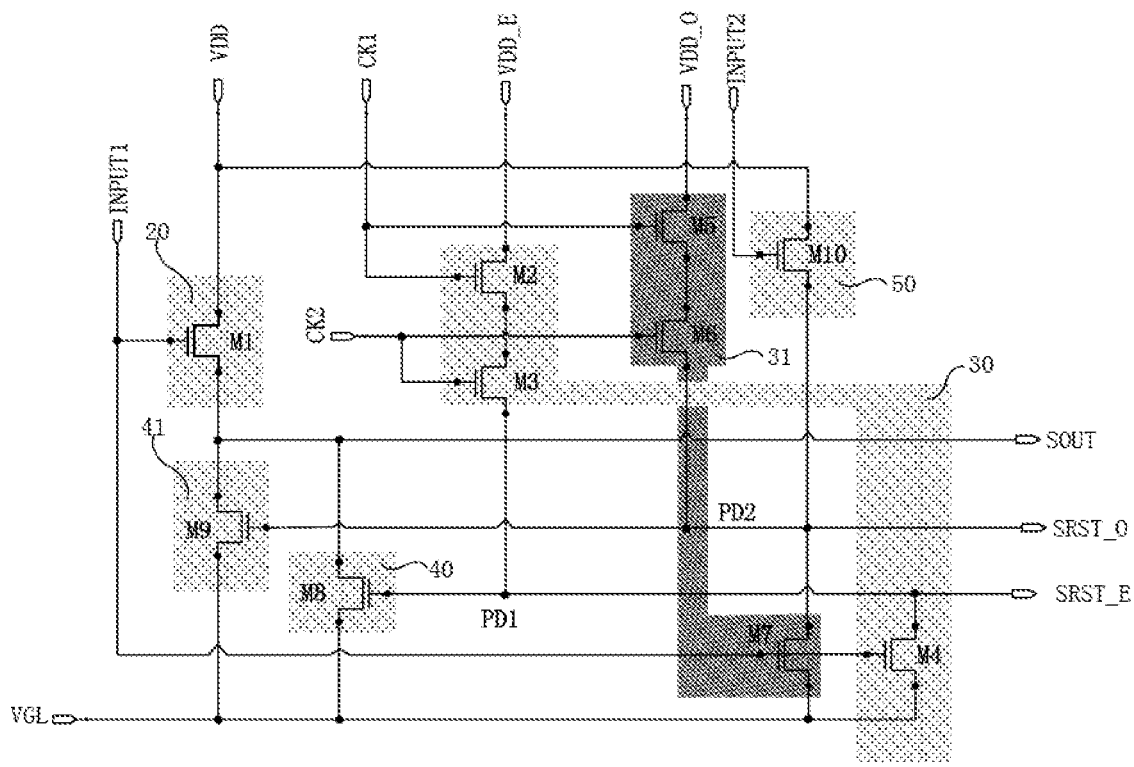
FIG. 9 shows a schematic diagram illustrating any one of the control circuits in the gate drive circuit as illustrated in FIG. 2 or FIG. 6.

Referring now to FIG. 9, in particular, the control circuit SR may include a first pull-up control module 20, a first pull-down control module 30, a second pull-down control module 31, a first pull-down module 40, a second pull-down module 41, and a reset module 50.

The first pull-up control module 20 may be coupled to a first signal input terminal INPUT1, a signal output terminal SOUT of the control circuit SR, and a first voltage terminal VDD. The first pull-up control module 20 may be configured to output a signal of the first voltage terminal VDD to the signal output terminal SOUT of the control circuit SR under the control of the first signal input terminal INPUT1. The first voltage terminal VDD may be configured to output a constant high level.

Typically, the first pull-up control module 20 may include a first transistor M1. A gate of the first transistor M1 may be coupled to the first signal input terminal INPUT1, a first electrode of the first transistor M1 may be coupled to the first voltage terminal VDD, and a second electrode may be coupled to the signal output terminal SOUT of the control circuit SR.

The first pull-down control module 30 may be coupled to the first clock signal terminal CK1, the second clock signal terminal CK2, the first signal input terminal INPUT1, a second voltage terminal VDD_E, a fourth voltage terminal VGL, and a first pull-down node PD1. The first pull-down node PD1 may be used to provide an output terminal SRST_E for the buffer circuits BF.

As such, the first pull-down control module 30 may be configured to output a voltage of the second voltage terminal VDD_E to the first pull-down node PD1 under the control of the first clock signal terminal CK1 and the second clock signal terminal CK2. Or, the first pull-down control module 30 may be used to output a voltage of the fourth voltage terminal VGL to the first pull-down node PD1 under the control of the first signal input terminal INPUT1.

Typically, the first pull-down control module 30 may include a second transistor M2, a third transistor M3, and a fourth transistor M4.

A gate of the second transistor M2 may be coupled to the first clock signal terminal CK1, a first electrode of the second transistor M2 may be coupled to the second voltage terminal VDD_E, and a second electrode may be coupled to a first electrode of the third transistor M3.

A gate of the third transistor M3 may be coupled to the second clock signal terminal CK2, and a second electrode may be coupled to the first pull-down node PD1.

A gate of the fourth transistor M4 may be coupled to the first signal input terminal INPUT1, a first electrode of the fourth transistor M4 may be coupled to the fourth voltage terminal VGL, and a second electrode may be coupled to the first pull-down node PD1.

The second pull-down control module 31 may be coupled to the first clock signal terminal CK1, the second clock signal terminal CK2, the first signal input terminal INPUT1, a third voltage terminal VDD_O, the fourth voltage terminal VGL, and a second pull-down node PD2. The second pull-down node PD2 may be used to provide an output terminal SRST_O for the buffer circuits BF.

As such, the second pull-down control module 31 may be configured to output a voltage of the third voltage terminal VDD_O to the second pull-down node PD2 under the control of the first clock signal terminal CK1 and the second clock signal terminal CK2. Or, the second pull-down control module 31 may be used to output the voltage of the fourth voltage terminal VGL to the second pull-down node PD2 under the control of the first signal input terminal INPUT1.

Typically, the second pull-down control module 31 may comprise a fifth transistor M5, a sixth transistor M6, and a seventh transistor M7.

A gate of the fifth transistor M5 may be coupled to the first clock signal terminal CK1, a first electrode of the fifth transistor M5 may be coupled to the third voltage terminal VDD_O, and a second electrode may be coupled to a first electrode of the sixth transistor M6.

A gate of the sixth transistor M6 may be coupled to the second clock signal terminal CK2, and a second electrode may be coupled to the second pull-down node PD2.

A gate of the seventh transistor M7 may be coupled to the first signal input terminal INPUT1, a first electrode of the seventh transistor M7 may be coupled to the fourth voltage terminal VGL, and a second electrode may be coupled to the second pull-down node PD2.

Note, the above second voltage terminal VDD_E and the third voltage terminal VDD_O can alternately output a high level during a very short period of time, e.g., within 1 s, so that either of the first electrodes of the second transistor M2 and the fifth transistor M5 can be prevented from operating under a high voltage state for a long period of time which may otherwise cause the threshold voltage to shift. In addition, a constant low level may be input to the fourth voltage terminal VGL.

The first pull-down module 40 may be coupled to the first pull-down node PD1, the signal output terminal SOUT of the control circuit SR, and the fourth voltage terminal VGL. The first pull-down module 40 may be configured to pull a voltage of the signal output terminal SOUT to the voltage of the fourth voltage terminal VGL under the control of the first pull-down node PD1.

Typically, the first pull-down module 40 may comprise an eighth transistor M8. A gate of the eighth transistor M8 may be coupled to the first pull-down node PD1, a first electrode of the eighth transistor M8 may be coupled to the fourth voltage terminal VGL and a second electrode may be coupled to the signal output terminal SOUT of the control circuit SR.

The second pull-down module 41 may be coupled to the second pull-down node PD2, the signal output terminal SOUT of the control circuit SR, and the fourth voltage terminal VGL. The second pull-down module 41 may be configured to pull down the voltage of the signal output terminal SOUT to the voltage of the fourth voltage terminal VGL under the control of the second pull-down node PD2.

Typically, the second pull-down module 41 may comprise a ninth transistor M9. A gate of the ninth transistor M9 may be coupled to the second pull-down node PD2, a first electrode of the ninth transistor M9 may be coupled to the fourth voltage terminal VGL, and a first electrode may be coupled to the signal output terminal SOUT of the control circuit SR.

Furthermore, the reset module 50 may be coupled to a second signal input terminal INPUT2, the first voltage terminal VDD, and the second pull-down node PD2. The reset module 50 may be configured to transfer the voltage of the first voltage terminal VDD to the second pull-down node PD2 under the control of the second signal input terminal INPUT2.

Typically, the reset module 50 may comprise a tenth transistor M10, where a gate of the tenth transistor M10 may be coupled to the second signal input terminal INPUT2, a first electrode of the tenth transistor M10 may be coupled to the first voltage terminal VDD, and a second electrode may be coupled to the second pull-down node PD2.

Figure 10:
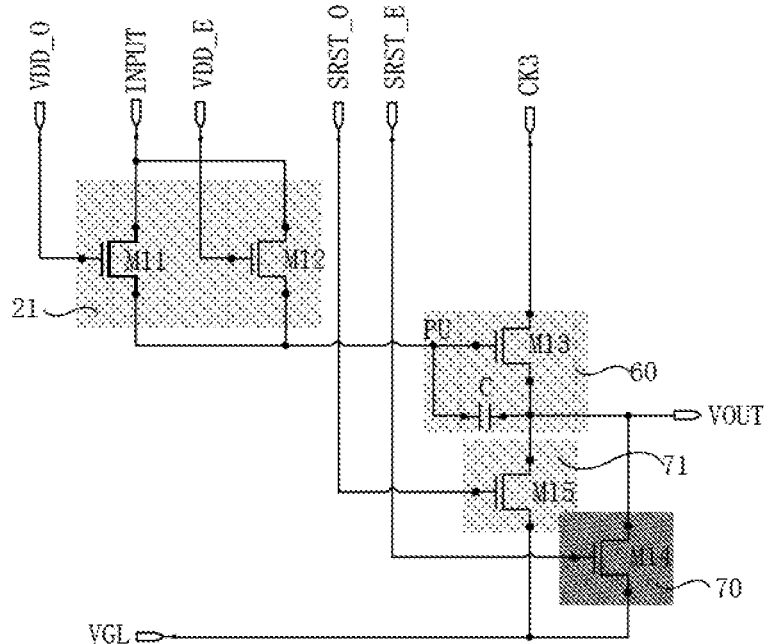
FIG. 10 shows a schematic diagram illustrating any of the buffer circuits in the gate drive circuit as illustrated in FIG. 2 or FIG. 6.

Referring now to FIG. 10, each buffer circuit BF in the shift register unit 10 may include a pull-up module 60, a second pull-up control module 21, a third pull-down module 70, and a fourth pull-down module 71.

The second pull-up control module 21 may be coupled to a pull-up control node PU, the second voltage terminal VDD_E, the third voltage terminal VDD_O, and the signal output terminal SOUT of the control circuit SR. The second pull-up control module 21 may be configured to turn on and output a signal of the signal output terminal SOUT to the pull-up control node PU under the control of the second voltage terminal VDD_E and the third voltage terminal VDD_O.

Typically, the second pull-up control module 21 may comprise an eleventh transistor M11 and a twelfth transistor M12. A gate of the eleventh transistor M11 may be coupled to the third voltage terminal VDD_O, a first electrode of the eleventh transistor M11 may be coupled to the signal output terminal SOUT of the control circuit SR, and a second electrode may be coupled to the pull-up control node PU.

A gate of the twelfth transistor M12 may be coupled to the second voltage terminal VDD_E, a first electrode of the twelfth transistor M12 may be coupled to the signal output terminal SOUT of the control circuit SR, and a second electrode may be coupled to the pull-up control node PU.

The pull-up module 60 may be coupled to the pull-up control node PU, a third clock signal terminal CK3, and the signal output terminal VOUT of the buffer circuit BF. The pull-up module 60 may be used to output a signal of the third clock signal terminal CK3 to the signal output terminal VOUT of the buffer circuit BF under the control of the pull-up control node PU.

In order to distinguish from the clock signal terminals of the control circuit SR, i.e., the above-described first clock signal terminal CK1 and second clock signal terminal CK2, the clock signal terminal CK of the buffer circuit BF as shown in FIG. 2 or FIG. 6 is herein referred to as the third clock signal terminal CK3.

Typically, the pull-up module 60 may include a thirteenth transistor M13 and a storage capacitor C. A gate of the thirteenth transistor M13 may be coupled to the pull-up control node PU, a first electrode of the thirteenth transistor M13 may be coupled to the third clock signal terminal CK3, and a second electrode may be coupled to the signal output terminal VOUT of the buffer circuit BF.

One terminal of the storage capacitor C may be coupled to the gate of the thirteenth transistor M13, while the other terminal thereof may be coupled to the second electrode of the thirteenth transistor M13.

The third pull-down module 70 may be coupled through the interface SRST_E to the first pull-down node PD1. The third pull-down module 70 further may be coupled to the fourth voltage terminal VGL and the signal output terminal VOUT of the buffer circuit BF. The third pull-down module 70 may be configured to pull down the voltage of the signal output terminal VOUT to the voltage of the fourth voltage terminal VGL under the control of the first pull-down node PD1.

In particular, the third pull-down module 70 may include a fourteenth transistor M14, where a gate of the fourteenth transistor M14 may be coupled to the first pull-down node PD1, a first electrode of the fourteenth transistor M14 may be coupled to the fourth voltage terminal VGL, and a second electrode may be coupled to the signal output terminal VOUT.

The fourth pull-down module 71 may be coupled through the interface SRST_E to the second pull-down node PD2. The fourth pull-down module 71 further may be coupled to the fourth voltage terminal VGL and the signal output terminal VOUT of the buffer circuit BF. The fourth pull-down module 71 may be configured to pull down the voltage of the signal output terminal VOUT to the voltage of the fourth voltage terminal VGL under the control of the second pull-down node PD2.

Typically, the fourth pull-down module 71 may comprise a fifteenth transistor M15. A gate of the fifteenth transistor M15 may be coupled to the second pull-down node PD2, a first electrode of the fifteenth transistor M15 may be coupled to the fourth voltage terminal VGL, and a second electrode may be coupled to the signal output terminal VOUT.

Note, in the present disclosure the types of the above-mentioned transistors are not limited. For example, the above transistors can all be N type transistors or P type transistors. In the above description the first electrode of a transistor may be the source and the second electrode the drain; or the first electrode may be the drain and the second electrode the source.

Figure 11:
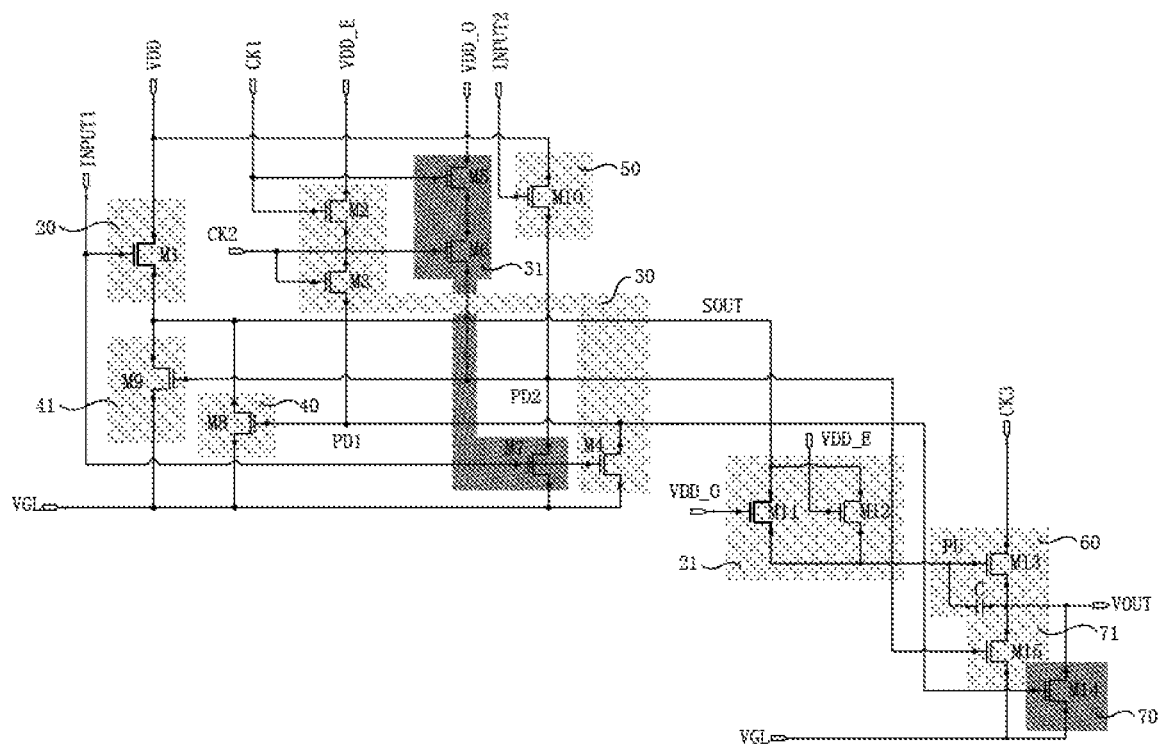
FIG. 11 is a schematic diagram illustrating a circuit formed by connecting the control circuit as shown in FIG. 9 with the buffer circuit as shown in FIG. 10.

Further, the control circuit SR as shown in FIG. 9 can be connected to the buffer circuit as shown in FIG. 10 to form the circuit structure as illustrated in FIG. 11. Hereinafter, the drive method for any of the shift register units 10 shown in FIG. 2 will be described in detail in based on the circuit configuration shown in FIG. 11 where the above-described transistors are all N type transistors for example.

With a display device that employs the gate drive circuit as illustrated in FIG. 2 and that has an intrinsic resolution of 8K, the signal timing as shown in FIG. 3 may be adopted when the display device needs to display contents at its intrinsic resolution. Accordingly, the clock signals input from the first system clock signal terminal CLK1, the second system clock signal terminal CLK2, the third system clock signal terminal CLK3, the fourth system clock signal terminal CLK4, the fifth system clock signal terminal CLK5, the sixth system clock signal terminal CLK6, the seventh system clock signal terminal CLK7, the eighth system clock signal terminal CLK5, the ninth system clock signal terminal CLK9, the tenth system clock signal terminal CLK10, the eleventh clock signal terminal CLK11, and the twelfth system clock signal terminal CLK12 in turn may constitute a certain phase difference.

On basis of the above, a drive method within a single image frame for the first shift register unit 10_1 in drive group 01 coupled to the gate lines (G1-G12) is described in detail as follows.

One image frame may include a first stage T1, a second stage T2, and a third stage T3, in particular, as shown in FIG. 3 or FIG. 4 or FIG. 5.

First, at the first stage T1, the first signal input terminal INPUT1 of the control circuit SR of the first shift register unit 10_1 may receive a start signal from the start signal terminal STV. At this point, as shown in FIG. 11, the first transistor M1 may be switched on and so may output a high level of the first voltage terminal VDD to the signal output terminal SOUT of the control circuit SR which may further transfer the above high level to the first buffer circuit BF_1.

Then, the eleventh transistor M11 and the twelfth transistor M12 in the first buffer circuit BF_1 may be switched on and so may transfer the output high level of the signal output terminal SOUT to the storage capacitor C and to the gate of the thirteenth transistor M13. Thus, the storage capacitor C would store the above high level. At this point, the clock signal terminal of the first buffer circuit BF_1, namely the third clock signal terminal CK3 may receive from the first system clock signal terminal CLK1 a low level clock signal, as shown in FIG. 3. The low level may be transferred to the signal output terminal VOUT of the first buffer circuit BF_1 through the conducting thirteenth transistor M13. As a result, gate line G1 coupled to this signal output terminal VOUT may output a low level.

Further, as shown in FIG. 3, since the eighth system clock signal terminal CLK8 coupled to the first clock signal terminal CK1 of the control circuit SR_1 and the ninth system clock signal terminal CLK9 coupled to the second clock signal terminal CK2 of the control circuit SR_1 both are fed low levels, the second transistor M2, the third transistor M3, the fifth transistor M5, and the sixth transistor M6 may all be turned off.

In addition, the first signal input terminal INPUT1 may be fed a high level and so the fourth transistor M4 may be turned on, so that the electric potential of the first pull-down node PD1 may be pulled down to the low level of the fourth voltage terminal VGL, and at this point both the eighth transistor M8 and the fourteenth transistor M14 may be turned off. Likewise, the first signal input terminal INPUT1 may be fed a high level and so the seventh transistor M7 may be turned on, so that the electric potential of the second pull-down node PD2 may be pulled down to the low level of the fourth voltage terminal VGL, and at this point both the ninth transistor M9 and the fifteenth transistor M15 may be turned off. In addition, since the second signal input terminal INPUT2 is fed a low level, the tenth transistor M10 may be turned off.

As described above, because at the first stage T1 the signal output terminal VOUT of the first buffer circuit BF_1 that is coupled to gate line G1 outputs a low level, the row of pixels coupled to this gate line G1 may not be turned on.

Next, in the second stage 12, the storage capacitor C as shown in FIG. 11 may release the high level stored in the previous stage, so that the electric potential of the pull-up control node PU may be increased and so the thirteenth transistor M13 may be switched on. At this point, the third clock signal terminal CK3 may receive from the first system clock signal terminal CLK1 a high level clock signal, as shown in FIG. 3, causing the signal output terminal VOUT of the first buffer circuit BF_1 to output a high level to gate line G1 coupled thereto.

The other transistors are turned off or turned on in a similar manner as described above and are not to be detailed again herein.

As described above, since at the second stage T2 the signal output terminal VOUT of the first buffer circuit BF_1 that is coupled to gate line G1 outputs a high level, so that the row of pixels coupled to this gate line G1 may be turned on.

Finally, in the third stage T3, because the eighth system clock signal terminal CLK8 coupled to the first clock signal terminal CK1 of the control circuit SR_1 and the ninth system clock signal terminal CLK9 coupled to the second clock signal terminal CK2 of the control circuit SR_1 both are fed high levels, the second transistor M2, the third transistor M3, the fifth transistor M5, and the sixth transistor M6 may all be turned on.

Therefore, the high level of the second voltage terminal VDD_E may be transferred to the first pull-down node PD1 through the second transistor M2 and the third transistor M3, causing the electric potential of the first pull-down node PD1 to go up. At this point, the eighth transistor M8 and the fourteenth transistor M14 may both be turned on, and so the eighth transistor M8 may pull the voltage of the signal output terminal SOUT of the control circuit SR_1 down to the low level of the fourth voltage terminal VGL. As such, the thirteenth transistor M13 may be turned off. In addition, the fourteenth transistor M14 may pull the voltage of the signal output terminal VOUT of the first buffer circuit BF_1 down to the low level of the fourth voltage terminal VGL.

Similarly, the high level of the third voltage terminal VDD_O may be transferred to the second pull-down node PD2 through the fifth transistor M5 and the sixth transistor M6, causing the electric potential of the second pull-down node PD2 to rise. At this point, the ninth transistor M9 and the fifteenth transistor M15 may both be turned on, and so the ninth transistor M9 may pull the voltage of the signal output terminal SOUT of the control circuit SR_1 down to the low level of the fourth voltage terminal VGL. As such, the thirteenth transistor M13 may be turned off. In addition, the fifteenth transistor M15 may pull the voltage of the signal output terminal VOUT of the first buffer circuit BF_1 down to the low level of the fourth voltage terminal VGL.

Further, the second signal input terminal INPUT2 may be fed a high level and so the tenth transistor M10 may be turned on, so that the voltage of the first voltage terminal VDD may be output to the second pull-down node PD2, which may control the fourteenth transistor M14 and the fifteenth transistor M15 to turn on so as to reset the signal output terminal SOUT of the control circuit SR_1.

As described above, because at the third stage T3 the voltage signal output terminal VOUT of the first buffer circuit BF_1 that is coupled to gate line G1 is pulled down to the low level of the fourth voltage terminal VGL, the row of pixels coupled to this gate line G1 may not be turned on.

As can be concluded, the signal output terminal VOUT of the first buffer circuit BF_1 may output a gate scan signal to gate line G1 during the second stage T2. Since the first shift register unit 10_01 is controlled by using the clock signal as shown in FIG. 3, the first buffer circuit BF_1, the second buffer circuit BF_2, the third buffer circuit BF_3, and the fourth buffer circuit BF_4 in the first shift register unit 10_01 may output the above gate scan signal in turn to scan the gate lines G1 to G4 progressively.

Therefore, for the entire array substrate under the forward scan mode for example, each and every row of subpixels from top to bottom may be turned on so that the display device having the above-described gate drive circuit can display at its intrinsic resolution, since all rows of subpixels are turned on progressively. That said, when the above intrinsic resolution is 8K and the timing signal as shown in FIG. 3 is adopted, then the display device may display the picture at the 8K resolution.

Alternatively, to make the display device employing the gate drive circuit as shown in FIG. 2 display at 4K resolution, the timing signal as shown in FIG. 4 may be used. The drive method for any one of the shift register units of the gate drive circuit is as described above, and so is not to be detailed again. It can be seen from FIG. 4 that lines G1 and G2 are scanned simultaneously, while G3 and G4 are scanned simultaneously. Thus, for the entire array substrate under the forward scan mode for example, every two successive rows of sub-pixels arranged in order from top to bottom may be switched on simultaneously, and every two sub-pixels which spread in these two rows and which are located in one same column may receive the same data signal and so may display the same greyscale. As a result, the display device having the above-described gate drive circuit may display a resolution of one-half of the intrinsic resolution 8K, namely, 4K.

Alternatively, to make the display device employing the gate drive circuit as shown in FIG. 2 display at 2K resolution, the timing signal as shown in FIG. 5 may be used. The drive method for any one of the shift register units of the gate drive circuit is as described above, and so is not to be detailed again. It can be seen from FIG. 5 that lines G1, G2, G3, and G4 are scanned simultaneously. Thus, for the entire array substrate under the forward scan mode for example, every four successive rows of sub-pixels arranged in order from top to bottom may be switched on simultaneously, and every four sub-pixels that spread among the four rows and that are located in one same column may receive the same data signal and so may display the same greyscale. As a result, the display device having the above-described gate drive circuit may display a resolution of one quarter of the intrinsic resolution 8K, i.e., 2K.

Of course, the foregoing description is made to illustrate the drive method for the first shift register unit 10_1 based on the display device having the gate drive circuit as shown in FIG. 2 where the display resolution converts from 8K to 4K and from 8K to 2K. So, when the display resolution is switched from 8K to 4K or from 4K to 2K based on a display device having a gate drive circuit as shown in FIG. 6, the drive method for the first shift register unit 10_1 would be the same as above and so is not to be repeated herein.

There is also provided a display device including any of the gate drive circuits as described above which has the same structure and advantages as the gate drive circuits provided in the foregoing embodiments. Since the specific structures of the gate drive circuits have been described in detail in the foregoing embodiments, they are not to be detailed again herein.

In this embodiment, the display device may include at least a liquid crystal display (LCD) device and an organic light emitting diode (OLED) display device. For example, the display device may be a liquid crystal display, a liquid crystal television, a digital photo frame, a mobile phone, a tablet computer, or any other product or component equipped with display function.

There is also provided a method of driving any of the gate drive circuits as described above.

For example, when the display device employing the gate drive circuit displays contents at its intrinsic resolution, the method may include the following process.

First, different clock signals may be input to the clock signal terminals CK of the control circuit SR and of the buffer circuits BF in the same shift register unit 10, as shown in FIG. 1.

Then, different clock signals may be input to the clock signal terminals CK of every two buffer circuits BF in the same drive group 01.

As such, under the forward scan mode for example, when different signals are input from the above system clock signal terminals (CLK1, CLK2, . . . , CLK-U), the gate scan signals output from the buffer circuits BF in the same drive group 01 may in turn constitute a certain phase difference so that the gate lines coupled to the respective buffer circuits BF of the same drive group 01 can be turned on in a line-by-line manner. For the entire army substrate when the forward scan mode is applied, each and every row of subpixels from top to bottom would be tuned on so that the display device having the above-described gate drive circuit can display at its intrinsic resolution, since all rows of subpixels are turned on progressively.

Alternatively, when the display device having the gate drive circuit displays contents at a resolution lower than its intrinsic resolution, the above drive method may include the following process.

The same clock signals may be input to the clock signal terminals CK of at least two buffer circuits BF in a same shift register unit 10 as shown in FIG. 1, and so the signal output terminals VOUT of the at least two buffer circuits BF that receive the same clock signals may output their gate scan signals simultaneously.

Meanwhile, the clock signals fed to the clock signal terminals CK of the buffer circuits BF of every two shift register units 10 in the same drive group 01 may be different from each other.

As such, the gate scan signals output from the signal output terminals VOUT of the above at least two buffer circuits BF may be synchronized so that the gate lines respectively coupled to the at least two buffer circuits BF can be scanned simultaneously. As a result, the display device employing the gate drive circuit may display a picture at a resolution lower than its intrinsic resolution, leading to the purpose of reducing the display power consumption.

With reference made to the gate drive circuit as illustrated in FIG. 2, in particular, the method by which the same clock signals are fed to at least two buffer circuits BF in the same shift register unit 10 will be described as follows, where the display resolution of the display device having the gate drive circuit converts from 8K to 4K, for example.

Each drive group 01 of the gate drive circuit may be coupled to a number of 12 gate lines. As shown in FIG. 2, each of the above mentioned drive groups 01 may include a first shift register unit 10_1, a second shift register unit 10_2, and a third shift register unit 10_3. Each of first shift register unit 10_1, the second shift register unit 10_2, and the third shift register unit 10_3 may include a first buffer circuit BF_1, a second buffer circuit BF_2, a third buffer circuit BF_3, and a fourth buffer circuit BF_4.

In another embodiment, a method for driving a gate drive circuit, the gate drive circuit comprises Q groups of shift register units cascaded in series, one of the Q groups of shift register units cascaded in series comprising S shift register units cascaded in series, each of the S shift register units comprises a control circuit configured to output a control signal, M buffer circuits coupled to the control circuit, each of the S shift register units for outputting scan signals to M gate lines, and S×M clock signal lines, M clock signal lines of which is coupled to one of the S shift register units, Q, S and M are integer, S≥2, M≥2; the method comprising: providing S×M clock signals time-sequentially from a 1st clock signal to a S×M-th clock signal through the S×M clock signal lines respectively to the S shift register units in each of the Q groups of shift register units; wherein providing M clock signals through the M clock signal lines to the M buffer circuits in each of the S shift register units.

Optionally, the S×M clock signals sequentially from 1st clock signal to the S×M-th clock signal are provided with a time-delay between any pair of subsequent clock signals.

Optionally, the time-delay equals to 1/S×M of one period of each clock signal.

Optionally, the S×M clock signals sequentially from 1st clock signal to the S×M-th clock signal comprise a plurality of groups of clock signals, a time-delay is provided between two time-sequential groups of clock signals of the plurality of groups of clock signals, and clock signals in each of the plurality of groups of clock signals are in phase.

Optionally, each of the plurality of groups of clock signals comprises two clock signals of the S×M clock signals.

Optionally, each of the plurality of groups of clock signals comprises four clock signals of the S×M clock signals.

Optionally, wherein S=3, Q=4.

Optionally, wherein S=4, Q=2.

Turning to FIG. 4, the method may include inputting the same signals from the first system clock signal terminal CLK1 and to the second system clock signal terminal CLK2;

Inputting the same signals from the third system clock signal terminal CLK3 and to the fourth system clock signal terminal CLK4;

Inputting the same signals from the fifth system clock signal terminal CLK5 and to the sixth system clock signal terminal CLK6;

Inputting the same signals from the seventh system clock signal terminal CLK7 and to the eighth system clock signal terminal CLK8;

Inputting the same signals from the ninth system clock signal terminal CLK9 and to the tenth system clock signal terminal CLK10:

Inputting the same signals from the eleventh system clock signal terminal CLK11 and to the twelfth system clock signal terminal CLK12.

Meanwhile, the clock signals input from the first system clock signal terminal CLK1, the third system clock signal terminal CLK3, the fifth system clock signal terminal CLK5, the seventh system clock signal terminal CLK7, the ninth system clock signal terminal CLK9, and the eleventh system clock signal terminal CLK11 may in turn differ from one another by a certain phase difference.

The phase difference as mentioned above can be set according to actual needs of the user. As shown in FIG. 4, for example, when the high level duration of the clock signal is 5H, the time difference between two adjacent different clock signals may be 2H while the overlap portion may be 3H.

Thus, with respect to the drive group 01 coupled to the gate lines (G1-G12), gate lines G1 and G2 may receive their gate scan signals simultaneously. Likewise, gate lines G3 and G4 may receive their gate scan signals simultaneously; G5 and G6 may receive their gate scan signals simultaneously; G7 and G8 may receive their gate scan signals simultaneously; G9 and G10 may receive their gate scan signals simultaneously: and G11 and G12 may receive their gate scan signals simultaneously. Accordingly, for the entire array substrate under the forward scan mode for example, every two successive rows of sub-pixels arranged in order from top to bottom may be switched on simultaneously, and every two sub-pixels that spread in these two rows and that are located in one same column may receive the same data signal and so may display the same greyscale. As a result, the display device having the above-described gate drive circuit may display at a resolution of one-half of the intrinsic resolution 8K, i.e., 4K.

Alternatively, with reference to the gate drive circuit as shown in FIG. 2, the method by which the same clock signals are fed to at least two buffer circuits BF in the same shift register unit will be described as follows, where the display resolution of the display device having the gate drive circuit converts from 8K to 2K, for example.

In particular, the above method may include the following process in connection with FIG. 5.

The same signals may be input from the first system clock signal terminal CLK1, the second system clock signal terminal CLK2, the third system clock signal terminal CLK3, and the fourth system clock signal terminal CLK4.

The same signals may be input from the fifth system clock signal terminal CLK5, the sixth system clock signal terminal CLK6, the seventh system clock signal terminal CLK7, and the eighth system clock signal terminal CLK8.

The same signals may be input from the ninth system clock signal terminal CLK9, the tenth system clock signal terminal CLK10, the eleventh system clock signal terminal CLK11, and the twelfth system clock signal terminal CLK12.

The output clock signals of the first system clock signal terminal CLK1, the fifth system clock signal terminal CLK5, and the ninth system clock signal terminal CLK9 in turn may differ from each other by a certain phase difference. As shown in FIG. 5, for example, when the high level duration of the clock signal is 5H, the time difference between two adjacent different clock signals may be 5H while there is no overlap.

Thus, with respect to the drive group 01 coupled to the gate lines (G1-G12), gate lines G1, G2, G3, and G4 may receive their gate scan signals simultaneously, gate lines G5, G6, G7, and G8 may receive their gate scan signals simultaneously, and, likewise, gate lines G9, G10, G11, and G12 may receive their gate scan signals at the same time. Accordingly, for the entire array substrate under the forward scan mode for example, every four successive rows of sub-pixels arranged in order from top to bottom may be turned on simultaneously, and every four sub-pixels that spread among these four rows respectively and are located in one same column may receive the same data signal and so may display the same greyscale. As a result, the display device having the above-described gate drive circuit may display a resolution of one quarter of the intrinsic resolution 8K, i.e., 2K.

As described above, the display device having the gate drive circuit may be able to convert its display resolution from its intrinsic resolution 8K to 4K or from 8K to 2K, by controlling the output signals of the system clock signal terminals. Thus, when the resolution of the picture to be displayed is lower than its intrinsic resolution, the display device may display contents at a resolution of 4K or 2K to reduce the power consumption.

Thus, gate drive circuits, methods of driving the same, and associated display devices are provided herein. The gate drive circuit is used for outputting scan signals to gate lines and includes a number of N cascaded shift register units. Every number of S successive cascaded shift register units constitute a drive group, where N>S≥1 and both N and S are positive integers. Each shift register unit includes a control circuit and at least two buffer circuits coupled to the control circuit. The signal output terminal of each buffer circuit is coupled to a row of gate line. The clock signal terminals of every two buffer circuits in the same drive group are coupled to different system clock signal terminals. Furthermore, the clock signal terminals of the control circuit and those of the buffer circuits in the same shift register unit are coupled to different system clock signal terminals.

Simply put, each shift register unit includes a control circuit and at least two buffer circuits coupled to the control circuit, and the clock signal terminals of every two buffer circuits in the same drive group are coupled to different system clock signal terminals, and those of the control circuit and of the buffer circuits which are in the same shift register unit also are coupled to different system clock signal terminals. Therefore, the clock signal terminals of every two buffer circuits in each drive group can be made to receive different clock signals when the resolution of the picture to be displayed is equivalent to the intrinsic resolution of the display device. In particular, a start signal can be fed to the start signal terminal, and the gate scan signals sequentially output from the signal output terminals of the buffer circuits from top to bottom may in turn constitute a certain phase difference, so that all rows of gate lines can be scanned progressively. In this case, the display device employing the gate drive circuit can display contents at its intrinsic resolution.

Alternatively, when the resolution of the picture to be displayed is lower than the intrinsic resolution of the display device, the clock signal terminals of at least two buffer circuits in each shift register unit can be made to receive the same clock signals. As such, the gate scan signals output from the signal output terminals of the above at least two buffer circuits would be synchronized so that the gate lines respectively coupled to the two buffer circuits can be scanned simultaneously. In this case, the display device employing the gate drive circuit can display contents at a resolution lower than its intrinsic resolution, thus achieving the purpose of lowering the display power consumption.

As would be understood by those of ordinary skill in the art, all or part of the steps of the method embodiments described above may be accomplished by means of hardware in combination with program instructions which may be stored in a computer-readable storage medium and which at execution may perform the steps of the method embodiments as described above. The storage medium may include a variety of media, such as a ROM, RAM, disk, optical disk, or any other medium which can store program code.

The foregoing description merely depicts some exemplary embodiments of the disclosure and thus is not intended as limiting the scope of the disclosure. Any variations or substitutions that can be readily thought of by a person skilled in the art in light of the scope of the disclosure shall all be covered within the protection of the disclosure. Therefore, the scope of the disclosure is defined only by the appended claims.

What is claimed is:

1. A shift register unit cascaded in a gate drive circuit, wherein the shift register unit comprises:
   a control circuit configured to output a control signal,
   at least two buffer circuits coupled to the control circuit, each of the at least two buffer circuits configured to output a scan signal to a gate line,
   wherein the control circuit comprises:
   a first pull-up control circuit coupled to a first signal input terminal, a signal output terminal of the control circuit, and a first voltage terminal, the first pull-up control circuit configured to output a signal of the first voltage terminal to the signal output terminal of the control circuit under control of a signal of the first signal input terminal;
   a first pull-down control circuit coupled to a first clock signal terminal, a second clock signal terminal, the first signal input terminal, a second voltage terminal, a fourth voltage terminal, and a first pull-down node, the first pull-down control circuit configured to control a voltage level of the first pull-down node under control of signals of the first clock signal terminal, the second clock signal terminal and the first signal input terminal;
   a second pull-down control circuit coupled to the first clock signal terminal, the second clock signal terminal, the first signal input terminal, a third voltage terminal, the fourth voltage terminal, and a second pull-down node, the second pull-down control circuit configured to control a voltage level of the second pull-down node under control of signals of the first clock signal terminal, the second clock signal terminal and the first signal input terminal;
   a first pull-down circuit coupled to the first pull-down node, the signal output terminal of the control circuit, and the fourth voltage terminal, the first pull-down circuit configured to pull a voltage at the signal output terminal of the control circuit down to the voltage of the fourth voltage terminal under control of a voltage level of the first pull-down node;

a second pull-down circuit coupled to the second pull-down node, the signal output terminal of the control circuit, and the fourth voltage terminal, the second pull-down circuit configured to pull the voltage of the signal output terminal of the control circuit down to the voltage of the fourth voltage terminal under control of a voltage level of the second pull-down node; and a reset circuit coupled to a second signal input terminal, the first voltage terminal, and the second pull-down node, the reset circuit being configured to output a voltage of the first voltage terminal to the second pull-down node under control of a signal of the second signal input terminal;

wherein each of the at least two buffer circuits comprises:

a second pull-up control circuit coupled to a pull-up control node, the second voltage terminal, the third voltage terminal, and the signal output terminal of the control circuit, the second pull-up control circuit configured to turn on and output a signal of the signal output terminal of the control circuit to the pull-up control node under control of a signal of the second voltage terminal and a signal of the third voltage terminal;

a pull-up circuit coupled to the pull-up control node, a third clock signal terminal, and a signal output terminal of the buffer circuit, the pull-up circuit being configured to output a signal of the third clock signal terminal to the signal output terminal of the buffer circuit under control of a voltage of the pull-up control node;

a third pull-down circuit coupled to the first pull-down node, the fourth voltage terminal, and the signal output terminal of the buffer circuit, the third pull-down circuit being configured to pull a voltage of the signal output terminal of the buffer circuit down to the voltage of the fourth voltage terminal under control of a voltage level of the first pull-down node; and a fourth pull-down circuit is coupled to the second pull-down node, the fourth voltage terminal, and the signal output terminal of the buffer circuit, the fourth pull-down circuit configured to pull the voltage of the signal output terminal of the buffer circuit down to the voltage of the fourth voltage terminal under control of a voltage level of the second pull-down node.

2. The shift register unit according to claim 1, wherein the first pull-up control circuit comprises:

a first transistor, wherein a gate of the first transistor is coupled to the first signal input terminal, a first electrode of the first transistor is coupled to the first voltage terminal, and a second electrode thereof is coupled to the signal output terminal of the control circuit.

3. The shift register unit according to claim 1, wherein the first pull-down control circuit comprises: a second transistor, a third transistor, and a fourth transistor;

wherein a gate of the second transistor is coupled to the first clock signal terminal, a first electrode of the second transistor is coupled to the second voltage terminal, and a second electrode thereof is coupled to a first electrode of the third transistor;

wherein a gate of the third transistor is coupled to the second clock signal terminal, and a second electrode of the third transistor is coupled to the first pull-down node; and wherein a gate of the fourth transistor is coupled to the first signal input terminal, a first electrode of the fourth transistor is coupled to the fourth voltage terminal, and a second electrode thereof is coupled to the first pull-down node.

4. The shift register unit according to claim 1, wherein the second pull-down control circuit comprises a fifth transistor, a sixth transistor, and a seventh transistor;

wherein a gate of the fifth transistor is coupled to the first clock signal terminal, a first electrode of the fifth transistor is coupled to the third voltage terminal, and a second electrode thereof is coupled to a first electrode of the sixth transistor;

wherein a gate of the sixth transistor is coupled to the second clock signal terminal, and a second electrode of the sixth transistor is coupled to the second pull-down node; and wherein a gate of the seventh transistor is coupled to the first signal input terminal, a first electrode of the seventh transistor is coupled to the fourth voltage terminal, and a second electrode thereof is coupled to the second pull-down node.

5. The shift register unit according to claim 1, wherein the first pull-down circuit comprises:

an eighth transistor, wherein a gate of the eighth transistor is coupled to the first pull-down node, a first electrode of the eighth transistor is coupled to the fourth voltage terminal, and a second electrode thereof is coupled to the signal output terminal of the control circuit.

6. The shift register unit according to claim 1, wherein the second pull-down circuit comprises:

a ninth transistor, wherein a gate of the ninth transistor is coupled to the second pull-down node, a first electrode of the ninth transistor is coupled to the fourth voltage terminal, and a first second electrode thereof is coupled to the signal output terminal of the control circuit.

7. The shift register unit according to claim 1, wherein the reset circuit comprises:

a tenth transistor, where a gate of the tenth transistor is coupled to the second signal input terminal, a first electrode of the tenth transistor is coupled to the first voltage terminal, and a second electrode thereof is coupled to the second pull-down node.

8. The shift register unit according to claim 1, wherein the second pull-up control circuit comprises an eleventh transistor and a twelfth transistor;

wherein a gate of the eleventh transistor is coupled to the third voltage terminal, a first electrode of the eleventh transistor is coupled to the signal output terminal of the control circuit, and a second electrode thereof is coupled to the pull-up control node; and wherein a gate of the twelfth transistor is coupled to the second voltage terminal, a first electrode of the twelfth transistor is coupled to the signal output terminal of the control circuit, and a second electrode thereof is coupled to the pull-up control node.

9. The shift register unit according to claim 1, wherein the pull-up circuit comprises a thirteenth transistor and a storage capacitor;

wherein a gate of the thirteenth transistor is coupled to the pull-up control node, a first electrode of the thirteen transistor is coupled to the third clock signal terminal, and a second electrode thereof is coupled to the signal output terminal of the buffer circuit; and wherein one terminal of the storage capacitor is coupled to the gate of the thirteenth transistor, and another terminal thereof is coupled to the second electrode of the thirteenth transistor.

10. The shift register unit according to claim 1, wherein the third pull-down circuit comprises:
- a fourteenth transistor, wherein a gate of the fourteenth transistor is coupled to the first pull-down node, a first electrode of the fourteenth transistor is coupled to the fourth voltage terminal, and a second electrode thereof is coupled to the signal output terminal of the buffer circuit.

11. The shift register unit according to claim 1, wherein the fourth pull-down circuit comprises:
- a fifteenth transistor, wherein a gate of the fifteenth transistor is coupled to the second pull-down node, a first electrode of the fifteenth transistor is coupled to the fourth voltage terminal, and a second electrode thereof is coupled to the signal output terminal of the buffer circuit.

12. A gate drive circuit, comprising the shift register unit according to claim 1.

* * * * *